United States Patent
Park et al.

(10) Patent No.: US 10,978,536 B2
(45) Date of Patent: Apr. 13, 2021

(54) ORGANIC LIGHT EMITTING DIODE DISPLAY INCLUDING AN ANODE OVERLAPPING A VOLTAGE LINE

(71) Applicant: SAMSUNG DISPLAY CO., LTD., Yongin-si (KR)

(72) Inventors: Jun Hyun Park, Suwon-si (KR); Kang Moon Jo, Hwaseong-si (KR); Dong Woo Kim, Yongin-si (KR); Sung Jae Moon, Seongnam-si (KR); An Su Lee, Seoul (KR); Woong-Sik Choi, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/698,121

(22) Filed: Nov. 27, 2019

(65) Prior Publication Data

US 2020/0185481 A1 Jun. 11, 2020

(30) Foreign Application Priority Data

Dec. 7, 2018 (KR) .................. 10-2018-0157411
Dec. 20, 2018 (KR) .................. 10-2018-0166477

(51) Int. Cl.
*H01L 27/32* (2006.01)
*H01L 27/12* (2006.01)
(Continued)

(52) U.S. Cl.
CPC ...... *H01L 27/3265* (2013.01); *H01L 27/3248* (2013.01); *H01L 27/3262* (2013.01);
(Continued)

(58) Field of Classification Search
CPC .............. H01R 13/7175; H01S 3/0933; H05B 33/0896; H05B 45/60; H01H 2219/037;
(Continued)

(56) References Cited

U.S. PATENT DOCUMENTS

2013/0320314 A1* 12/2013 Kim .................. H01L 51/52
257/40
2014/0353629 A1* 12/2014 Jin .................. H01L 27/3262
257/40
(Continued)

FOREIGN PATENT DOCUMENTS

KR 10-2014-0080629 7/2014
KR 10-1441958 9/2014
(Continued)

*Primary Examiner* — Didarul A Mazumder
(74) *Attorney, Agent, or Firm* — F. Chau & Associates, LLC

(57) ABSTRACT

According to an exemplary embodiment, an organic light emitting diode display includes: a substrate; a semiconductor layer; a first gate insulating layer disposed on the oxide semiconductor layer; a first gate layer disposed on the first gate insulating layer; a first interlayer insulating layer disposed on the first gate layer; a first data layer disposed on the first interlayer insulating layer; a second interlayer insulating layer disposed on the first data layer; a driving voltage line and a driving low voltage line disposed on the second interlayer insulating layer and separated from each other; an upper insulating layer covering the driving voltage line and the driving low voltage line; and an anode disposed on the upper insulating layer and overlapping the driving voltage line or the driving low voltage line.

12 Claims, 20 Drawing Sheets

(51) Int. Cl.
    *G09G 3/3233*     (2016.01)
    *H01L 29/786*     (2006.01)
    *G09G 3/3291*     (2016.01)
    *G09G 3/3266*     (2016.01)

(52) U.S. Cl.
    CPC ....... H01L 27/3276 (2013.01); *G09G 3/3233* (2013.01); *G09G 3/3266* (2013.01); *G09G 3/3291* (2013.01); *G09G 2310/021* (2013.01); *H01L 27/124* (2013.01); *H01L 27/1225* (2013.01); *H01L 27/1255* (2013.01); *H01L 29/7869* (2013.01)

(58) Field of Classification Search
    CPC . H01L 2251/50; H01L 2227/32; H01L 27/32; H01L 51/50; H03K 2017/9634; H03K 2017/960795; H03K 2017/9656
    USPC ........................................ 257/40; 438/82, 99
    See application file for complete search history.

(56) References Cited

U.S. PATENT DOCUMENTS

| | | | |
|---|---|---|---|
| 2016/0284784 A1* | 9/2016 | Lee | ..................... H01L 27/3241 |
| 2017/0092198 A1* | 3/2017 | Ryu | ..................... G09G 3/3233 |
| 2018/0102498 A1 | 4/2018 | Shin et al. | |
| 2018/0108869 A1 | 4/2018 | Ahn et al. | |

FOREIGN PATENT DOCUMENTS

| | | |
|---|---|---|
| KR | 10-1631549 | 6/2016 |
| KR | 10-2017-0080223 | 7/2017 |
| KR | 10-1773661 | 8/2017 |
| KR | 10-2018-0004370 | 1/2018 |

\* cited by examiner

ORGANIC LIGHT EMITTING DIODE DISPLAY INCLUDING AN ANODE OVERLAPPING A VOLTAGE LINE

CROSS-REFERENCE TO RELATED APPLICATION

This U.S. non-provisional application claims the benefit of priority under 35 U.S.C. § 119 to Korean Patent Applications Nos. 10-2018-0157411 and 10-2018-0166477 filed in the Korean Intellectual Property Office on Dec. 7, 2018 and Dec. 20, 2018, respectively, the entire disclosures of which are incorporated by reference herein.

BACKGROUND

(a) Technical Field

The present disclosure relates to an organic light emitting diode display, and more particularly, to an organic light emitting diode display with a high resolution.

(b) Discussion of Related Art

Display devices are devices that display images. A flat panel display is a television, monitor or other display device that uses a thin panel design instead of a traditional cathode ray tube (CRT) design. Examples of flat panel displays include an organic light emitting diode (OLED) display and a liquid crystal display.

Since an organic light emitting diode display has a self-emission characteristic and does not require a separate light source, the organic light emitting diode display can be thinner and lighter than a liquid crystal display device. Further, the organic light emitting diode display may consume less power, have a higher luminance and have a higher response speed than a liquid crystal display.

However, since the organic light emitting diode (OLED) display has a more complicated pixel structure than a liquid crystal display, and it is difficult to provide a space for forming the pixel as the resolution increases.

SUMMARY

At least one exemplary embodiment of the inventive concept provides an organic light emitting diode display with a high resolution, in which a capacitance of a storage capacitor connected to one terminal of a driving transistor is increased.

According to an exemplary embodiment of the inventive concept, an organic light emitting diode display includes: a substrate; a semiconductor layer; a first gate insulating layer disposed on the oxide semiconductor layer; a first gate layer disposed on the first gate insulating layer; a first interlayer insulating layer disposed on the first gate layer; a first data layer disposed on the first interlayer insulating layer; a second interlayer insulating layer disposed on the first data layer; a driving voltage line and a driving low voltage line disposed on the second interlayer insulating layer and separated from each other; an upper insulating layer covering the driving voltage line and the driving low voltage line; and an anode disposed on the upper insulating layer and overlapping the driving voltage line or the driving low voltage line.

The driving voltage line and the driving low voltage line may extend in a longitudinal direction.

The anode may be electrically connected to an anode connection part formed to be separated from the driving voltage line and the driving low voltage line on a same layer.

In an embodiment, the organic light emitting diode display includes a plurality of pixels and the anode is disposed in each of the pixels.

A part of the anode may overlap the driving voltage line, and another part of the anode may overlap the driving low voltage line.

The anode connection part may be disposed between the driving voltage line and the driving low voltage line.

The anode may overlap the driving voltage line.

The driving voltage line may have an anode connection part opening corresponding to the anode connection part, and the anode connection part is disposed within the anode connection part opening.

In an exemplary embodiment, the organic light emitting diode display further includes an overlapping layer disposed between the substrate and the semiconductor layer, the overlapping layer including a channel overlapping part overlapping a channel of a first transistor and an extension part extended from the channel overlapping part, and the extension part of the overlapping layer overlaps a first gate electrode of the first transistor to form an overlapping capacitor.

The driving voltage line may have a parasitic capacitor opening so that the anode forms a parasitic capacitance with the first gate insulating layer or the first data layer.

In an exemplary embodiment, the organic light emitting display includes an organic emission layer disposed on the anode and a cathode disposed on the organic emission layer, the cathode is electrically connected to a cathode connection part disposed on a same layer as the anode, and the cathode connection part is electrically connected to the driving low voltage line.

In an exemplary embodiment, the driving voltage line has a larger width than the anode, and the driving low voltage line has a width that is larger than half of the width of the anode.

In an exemplary embodiment, the first gate layer includes a pair of scan lines receiving a same scan signal, the first data layer includes a pair of data lines connected to one pixel column, among two adjacent pixels included in the one pixel column, one pixel is connected to one scan line of the pair of scan lines and one data line of the pair of data lines, and the other pixel is connected to the other scan line of the pair of scan lines and the other data of the pair of data lines.

An organic light emitting diode display according to an exemplary embodiment of the inventive concept includes: a substrate; a semiconductor layer disposed on the substrate; a first gate insulating layer disposed on the semiconductor layer; a first gate layer disposed on the first gate insulating layer; a second gate insulating layer disposed on the first gate layer; a second gate layer disposed on the second gate insulating layer; a first interlayer insulating layer disposed on the second gate layer; a first data layer disposed on the first interlayer insulating layer and including a data line, an initialization voltage line, a driving voltage line, and a driving low voltage line; an upper insulating layer covering the first data layer; and an anode disposed on the upper insulating layer, wherein the anode includes an additional capacitor extension part, and the additional capacitor extension part overlaps the driving low voltage line.

In an exemplary embodiment, the organic light emitting diode display further includes an overlapping layer disposed between the substrate and the semiconductor layer, and the overlapping layer overlaps a channel of a first transistor.

In an exemplary embodiment, the driving voltage line and the driving low voltage line are adjacently disposed, and the width of the driving low voltage line is wider than the width of the driving voltage line.

The driving low voltage line may also overlap the driving voltage line.

In an exemplary embodiment, the organic light emitting diode display includes a second interlayer insulating layer disposed between the first data layer and the upper insulating layer and a second driving low voltage line disposed between the first data layer and the upper insulating layer. In this embodiment, the second interlayer insulating layer is disposed on the first data layer, the second driving low voltage line is disposed on the second interlayer insulating layer, and the driving low voltage line is electrically connected to the second driving low voltage line to transmit the driving low voltage through a dual structure.

In an exemplary embodiment, the organic light emitting diode display includes a cathode connection part disposed on a same layer as the anode and electrically connected to the driving low voltage line, and the additional capacitor extension part of the anode is disposed and separated from the cathode connection part.

In an exemplary embodiment, the organic light emitting diode display includes a plurality of pixels, the anode is disposed in each of the pixels, and at least one anode does not include the additional capacitor extension part.

An organic light emitting diode display according to an exemplary embodiment of the inventive concept includes: a substrate; a semiconductor layer disposed on the substrate; a first gate insulating layer disposed on the semiconductor layer; a first gate layer disposed on the first gate insulating layer; a second gate insulating layer disposed on the first gate layer; a second gate layer disposed on the second gate insulating layer; an interlayer insulating layer disposed on the second gate layer; a data layer disposed on the interlayer insulating layer and including a data line and a driving voltage line; an upper insulating layer disposed on the data layer; and an anode disposed on the upper insulating layer and completely covering the gate electrode of a first transistor disposed on the first gate layer, wherein the anode overlaps the driving voltage line to form an additional capacitor.

The driving voltage line may extend in a longitudinal direction.

One side of the anode extending in the longitudinal direction may overlap the driving voltage line.

In an exemplary embodiment, the semiconductor layer include a first semiconductor, a second semiconductor, and a third semiconductor, the first transistor is disposed on the first semiconductor, a second transistor is disposed on the second semiconductor, and a third transistor is disposed on the third semiconductor.

At least one of the first semiconductor, the second semiconductor, and the third semiconductor may include an opening.

The first semiconductor may include a channel region, a source region, and a drain region, and the source region may overlap the anode and the driving voltage line.

The organic light emitting diode display may further include an overlapping layer disposed between the substrate and the semiconductor layer.

The overlapping layer may include a channel overlapping part overlapping the channel region of the first semiconductor and an extension part extending from the channel overlapping part, and the extension part of the overlapping part may overlap the gate electrode of the first transistor.

The second gate layer may include a storage electrode, the gate electrode of the first transistor and the storage electrode may overlap to form a storage capacitor, and the storage capacitor may completely overlap the anode.

The overlapping layer may be connected to the storage electrode through an opening, and the storage electrode may be electrically connected to the anode through the connection part formed in the data layer.

The second semiconductor may include a channel region, a source region, and a drain region, and the source region may overlap the data line to be electrically connected thereto.

In an exemplary embodiment, the organic light emitting diode display includes a transverse driving voltage line included in the first gate layer and extending in a horizontal direction crossing the driving voltage line.

In an exemplary embodiment, the organic light emitting diode display includes a plurality of pixels and the transverse driving voltage line is electrically connected to at least one pixel among the pixels adjacent in a row direction.

In an exemplary embodiment, the organic light emitting diode display includes an initialization voltage line included in the data layer and extending in a longitudinal direction.

In an exemplary embodiment, the organic light emitting diode display includes a plurality of pixels and an initialization voltage transmitting part disposed in a horizontal direction crossing the initialization voltage line, and the initialization voltage transmitting part is electrically connected to at least one pixel among the pixels adjacent in the row direction.

In an exemplary embodiment, the organic light emitting diode display further includes a driving low voltage line included in the data layer and extending in a longitudinal direction.

In an exemplary embodiment, the semiconductor layer includes a first semiconductor, a second semiconductor, and a third semiconductor, the first transistor is disposed on the first semiconductor, the second transistor is disposed on the second semiconductor, and the third transistor is disposed on the third semiconductor and the anode overlaps the first semiconductor, the second semiconductor, and the third semiconductor.

The first gate layer may further include a scan line and a previous scan line extending in a horizontal direction.

The first gate layer may include a gate electrode of the third transistor, and the gate electrode of the third transistor may be electrically connected to the previous scan line through a connection part included in the second gate layer and a connection part included in the data layer.

The organic light emitting diode display may further include an organic emission layer disposed on the anode and a cathode disposed on the organic emission layer.

According to exemplary embodiments, in an organic light emitting diode display with high resolution, the driving voltage line applying the driving voltage or the driving low voltage line applying the driving low voltage are formed to overlap the anode to form the additional capacitor, thereby having sufficient capacitance in a narrow area.

Also, by forming the driving low voltage line with the dual-layered structure, a voltage drop generated when applying the driving low voltage may be eliminated.

Further, as the capacitance of the storage capacitor connected to one end of the driving transistor is increased, the display quality of the display device may be improved.

According to an exemplary embodiment, since the anode does not overlap the data line, crosstalk due to parasitic capacitance with the data line may be reduced.

DETAILED DESCRIPTION OF EXEMPLARY EMBODIMENTS

Figure 1:
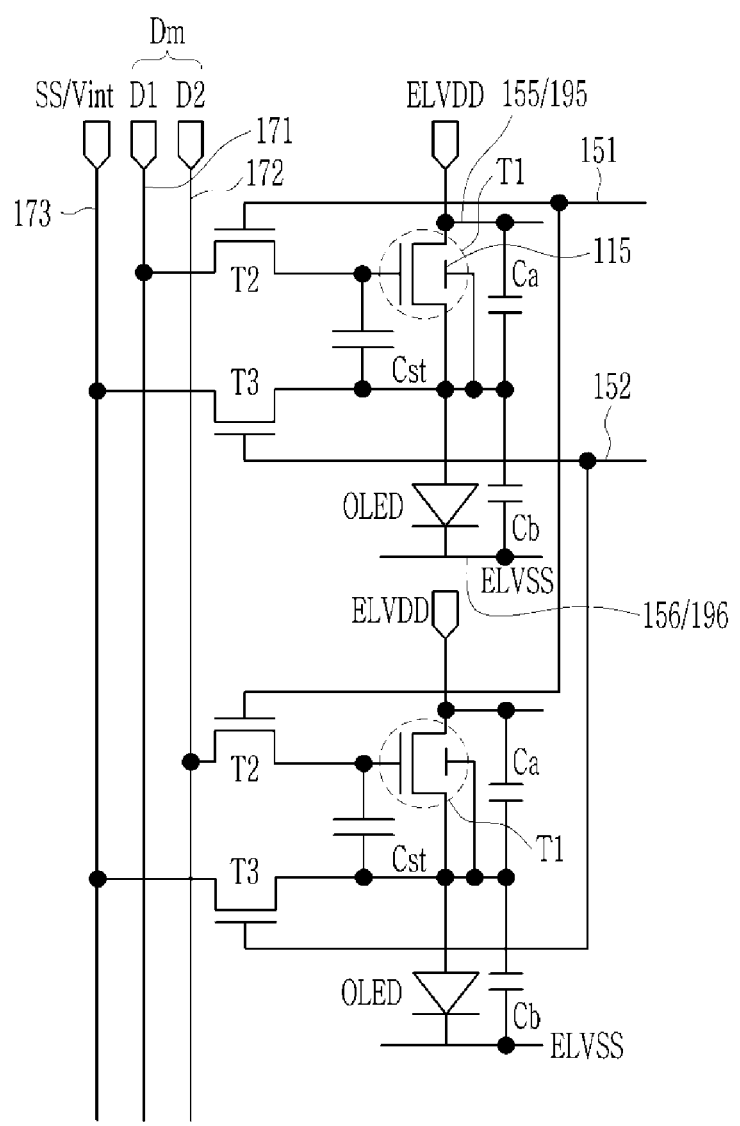
FIG. 1 is an equivalent circuit diagram of one pixel of an organic light emitting diode display according to an exemplary embodiment of the inventive concept.

The present inventive concept will be described more fully hereinafter with reference to the accompanying drawings, in which exemplary embodiments thereof are shown. As those skilled in the art would realize, the described embodiments may be modified in various different ways, all without departing from the spirit or scope of the present invention.

To clarify embodiments of the present inventive concept, like numbers refer to like elements throughout the specification.

In addition, the size and thickness of each configuration shown in the drawings are arbitrarily shown for better understanding and ease of description, but embodiments of the present inventive concept are not limited thereto.

It will be understood that when an element such as a layer, film, region, or substrate is referred to as being "on" another element, it can be directly on the other element or intervening elements may also be present.

Further, in this specification, the phrase "on a plane" means viewing a target portion from the top, and the phrase "on a cross-section" means viewing a cross-section formed by vertically cutting a target portion from the side.

Now, a pixel of an organic light emitting diode display according to an exemplary embodiment of the inventive concept is described with reference to FIG. 1.

FIG. 1 is an equivalent circuit diagram of one pixel of an organic light emitting diode display according to an exemplary embodiment of the inventive concept.

Referring to FIG. 1, a pixel PX of an organic light emitting diode display includes a plurality of transistors T1, T2, and T3, a storage capacitor Cst, additional capacitors Ca and Cb, and an organic light emitting diode (OLED), which are connected to several signal lines 151, 152, 171, 172, 173, 155 (195), and 156 (196).

The organic light emitting diode display according to an exemplary embodiment of FIG. 1 shows an organic light emitting diode display used in high resolution (4K or 8K), and two pixels PX are controlled by two data lines 171 and 172 and two scan lines 151 applied with the same signal.

First, the structure of the pixel PX is described.

A plurality of transistors T1, T2, and T3 included in one pixel PX include a driving transistor T1 (hereinafter referred to as a first transistor), and include a switching transistor T2 (hereinafter referred to as second transistor) connected to a scan line 151, and an initialization transistor T3 (hereinafter referred to as a third transistor or a sensing transistor) connected to a previous scan line 152. In an exemplary embodiment, the third transistor T3 is connected to a signal line that applies a gate-on voltage at different timing from the previous scan line 152.

The plurality of signal lines 151, 152, 171, 172, 173, 155 (195), and 156 (196) included in one pixel PX may include the scan line 151, a previous scan line 152, the data lines 171 and 172, an initialization voltage line 173 (hereinafter referred to as a sensing line), a driving voltage line (155 and 195), and a driving low voltage line (156 and 196).

The scan line 151 is connected to a gate driver (not shown) to transmit a scan signal Sn to the second transistor T2. The gate driver may be implemented by a gate driving circuit. The scan line 151 is connected to the pixels PX included in the two rows while coming from the gate driver in one line and being separated into two lines in the display area where the pixels PX are disposed. The scan line 151, which is separated into two lines that receive the same scan signal Sn, is hereinafter also referred to as a pair of scan lines 151.

The previous scan line 152 is connected to the gate driver and transfers the previous scan signal S(n−1) applied to the pixel PX disposed at the previous stage to the third transistor T3. The previous scan line 152 is separated into two lines like the scan line 151 to be connected to the pixels PX included in two rows. The previous scan line 152 is separated into two lines that are applied with the same previous scan signal S(n−1), and is also referred to as a pair of previous scan lines 152.

The data lines 171 and 172 are wiring transmitting a data voltage Dm generated from a data driver (not shown), and the two data lines 171 and 172 are formed for one pixel column. The data driver may be implemented by a data driving circuit. For example, data line 171 may transmit a first data voltage D1 and data line 172 may transmit a second data voltage D2. The two data lines 171 and 172 formed for one pixel column are also referred to as a pair of data lines 171 and 172. The pair of data lines 171 and 172 and the pair of scan lines 151 are connected to two pixels PX included in one pixel column. That is, one of two pixels PX included in the pixel column is connected to the first data line 171 and one of the pair of scan lines 151, and the other of the two pixels is connected to the second data line 172 and the other of the pair of scan lines 151. The two adjacent pixels PX included in the pixel column are connected to different data lines 171 and 172 and scan lines 151 of the pair of data lines 171 and 172 and the pair of scan lines 151. Luminance of light emitted from the organic light emitting diode (OLED) (referred to as an organic light emitting element) changes depending on the data voltage Dm provided to the pixel PX along the data lines 171 and 172.

In an exemplary embodiment, the driving voltage lines 155 and 195 apply a driving voltage ELVDD, and the driving low voltage lines 156 and 196 apply the driving low voltage ELVSS. In an embodiment, the driving voltage ELVDD is higher than the driving low voltage ELVSS. The driving voltage lines 155 and 195 and the driving low voltage lines 156 and 196 according to a present exemplary embodiment include wiring extending in a horizontal direction and wiring extending in a longitudinal direction, and are formed with a mesh structure. Also, the layers of the wiring extending in the horizontal direction and the wiring extending in the longitudinal direction are different from each other so that the reference numeral is also given as different numbers. The voltages applied to the driving voltage lines 155 and 195 and the driving low voltage lines 156 and 196 may be a predetermined voltage, respectively. The driving voltage ELVDD acts as an input voltage to generate an output current from the driving transistor T1, and when the output current is applied to the anode of the organic light emitting diode (OLED), the driving low voltage ELVSS is applied to the cathode electrode of the OLED.

Hereinafter, a plurality of transistors are described.

First, the driving transistor T1 is a transistor controlling a magnitude of the current output depending on the data voltage Dm applied to the gate electrode, and the output driving current Id is applied to the organic light emitting diode (OLED) such that brightness of the organic light emitting diode (OLED) is controlled depending on the data voltage Dm. For this purpose, the first electrode (an input side electrode) of the driving transistor T1 is disposed to receive the driving voltage ELVDD, and the second electrode (an output side electrode) is connected to the first electrode (hereinafter referred to as an anode or a pixel electrode) of the organic light emitting diode (OLED). Also, the gate electrode of the driving transistor T1 is connected to the second electrode (the output side electrode) of the second transistor T2 to receive the data voltage Dm.

In an embodiment, the gate electrode of the driving transistor T1 is connected to one electrode of the storage capacitor Cst. The storage capacitor Cst ensures that the data voltage Dm transmitted to the gate electrode of the driving transistor T1 is maintained for one frame period. Therefore, the voltage of the gate electrode of the driving transistor T1 changes depending on the voltage stored in the storage capacitor Cst, and accordingly, the driving current Id output from the driving transistor T1 is changed and is constantly output during one frame period. In an exemplary embodiment, one frame period is a period during which image data is output to all pixels of the display device.

The driving transistor T1 includes a semiconductor layer in which a channel is disposed. In an exemplary embodiment, the driving transistor T1 further includes an overlapping layer 115 disposed under a portion of the semiconductor layer in which the channel is disposed. The overlapping layer 115 overlaps the channel and the gate electrode of the driving transistor T1, thereby improving a characteristic of the driving transistor T1 and maintaining the voltage of the gate electrode. Since the overlapping layer 115 overlaps the gate electrode, the voltage of the gate electrode is maintained, thereby supplementing the capacitance of the storage capacitor Cst. Hereinafter, a capacitor formed by the overlapping between the overlapping layer 115 and the gate electrode of the driving transistor T1 is referred to as an overlapping capacitor (not shown). The overlapping layer 115 is electrically connected to the second electrode (the output side electrode) of the driving transistor T1, and as a result, the overlapping layer 115 is also connected to the anode of the resultant organic light emitting diode (OLED).

The second transistor T2 (hereinafter referred to as the switching transistor) is a transistor that receives the data voltage Dm as input to the pixel PX. The gate electrode of the second transistor T2 is connected to the scan line 151, the first electrode of the second transistor T2 is connected to the data line 171, and the second electrode (the output side electrode) of the second transistor T2 is connected to the gate electrode of the driving transistor T1. If the second transistor T2 is turned on depending on the scan signal Sn transmitted through the scan line 151, the data voltage Dm transmitted through the connected data line of a pair of data lines 171 and 172 is transmitted to the gate electrode of the driving transistor T1 and is stored to the storage capacitor Cst.

The third transistor T3 (hereinafter referred to as the initialization transistor or the sensing transistor) plays a role of initializing the second electrode (the output side electrode) of the driving transistor T1, one electrode of the storage capacitor Cst, and the anode of the organic light emitting diode (OLED). The gate electrode of the third transistor T3 is connected to the previous scan line 152, and the first electrode of the third transistor T3 is connected to the initialization voltage line 173. The second electrode of the third transistor T3 is electrically connected to the second electrode (the output side electrode) of the driving transistor T1, and as a result, is also connected to the anode of the organic light emitting diode (OLED) and the overlapping layer 115.

The initialization voltage line 173 not only provides an initialization voltage, but is also used as wiring (e.g., a sensing line) for sensing the voltage of the anode connected to the second electrode of the third transistor T3 according to a sensing period. As a result, the third transistor T3 is also referred to as the sensing transistor.

The operation of the third transistor T3 is now described. The voltage of the anode when the organic light emitting diode (OLED) emits light (an emitting period) is stored on one electrode of the storage capacitor Cst. At this time, the data voltage Dm is stored in the other electrode of the storage capacitor Cst. At this time, if the gate-on voltage is applied to the gate electrode of the third transistor T3, the initialization voltage line 173 operates as a sensing line, and the voltage of the anode is transmitted to a sensing unit (not shown) through the sensing line. Hereinafter, this is referred to as a sensing period. Next, in a reset period among the period in which the gate-on voltage is applied to the gate electrode of the third transistor T3, the initialization voltage line 173 applies the initialization voltage Vint to initialize the voltage of the anode. Hereinafter, this is referred to as an initialization period.

If the voltage (e.g., a sensing signal SS) detected in the sensing period is different from the voltage of the anode that is expected when it is determined based on the applied data voltage Dm, the data voltage Dm may be modified to be provided to the pixel PX. That is, the characteristic of the driving transistor T1 may be changed, and the organic light emitting diode (OLED) may emit normal light by sensing the change and providing the data voltage Dm corresponding thereto.

That is, two electrodes of the storage capacitor Cst play a role of maintaining the data voltage Dm and the voltage of the anode (the output electrode voltage of the driving transistor) of the organic light emitting diode (OLED) during one frame period.

However, since the area occupied by a pixel PX of an organic light emitting diode display of a high resolution and the area for forming a storage capacitor Cst in the pixel PX are small, a storage capacitance may be insufficiently maintained for one frame period.

Therefore, the pixel PX of the present exemplary embodiment further includes first and second additional capacitors Ca and Cb to have sufficient storage capacitance to maintain the voltage of the anode of the organic light emitting diode (OLED) for one frame period.

The first additional capacitor Ca has one side electrode connected to the anode of the organic light emitting diode (OLED) and the other side electrode to which the driving voltage ELVDD is applied. That is, the first additional capacitor Ca plays a role of maintaining the voltage of the anode of the organic light emitting diode (OLED).

Also, since the second additional capacitor Cb has one side electrode connected to the anode of the organic light emitting diode (OLED) and the other side electrode to which the driving low voltage ELVSS is applied, the second additional capacitor Cb also plays a role of maintaining the voltage of the anode of the organic light emitting diode (OLED).

Therefore, the capacitor included in one pixel PX has the storage capacitor Cst and the additional capacitors Ca and Cb, thereby ensuring sufficient storage capacitance for maintaining the voltage of the anode of the organic light emitting diode (OLED) during one frame period. Also, according to an exemplary embodiment, an overlapping capacitor formed by the overlapping layer 115 may be further included.

According to an exemplary embodiment of the inventive concept, the pixel PX further includes only the first additional capacitor Ca or further includes only the second additional capacitor Cb. In addition, the neighboring pixel PXs may have the additional capacitors Ca and Cb of different sizes. In addition, although the capacitance of the first additional capacitor Ca and the capacitance of the second additional capacitor Cb may be different from each other in the adjacent pixels PX, the sum of the capacitances of the two additional capacitors Ca and Cb may be set to be substantially constant.

The operation of one pixel of the organic light emitting diode display according to an exemplary embodiment of the inventive concept is now described with reference to FIG. 1 and FIG. 2.

Figure 2:
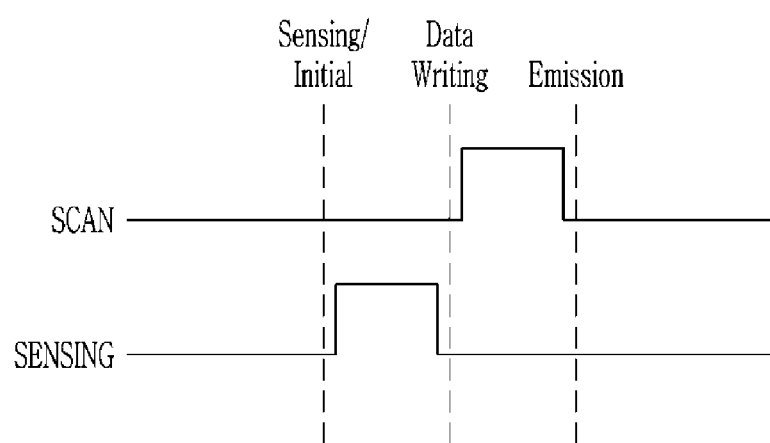
FIG. 2 is a timing diagram of a signal applied to one pixel of an organic light emitting diode display according to an exemplary embodiment of the inventive concept.

FIG. 2 is a timing diagram of a signal applied to one pixel of an organic light emitting diode display according to an exemplary embodiment of the inventive concept.

In FIG. 2, a signal labeled SCAN is the signal applied to the scan line 151, and a signal labeled SENSING indicates the signal applied to the previous scan line 152.

First, during a sensing/initial period, the previous scan signal S(n−1) of a high level is supplied to the pixel PX through the previous scan line 152. Then, the third transistor T3 receiving the previous scan signal S(n−1) is turned on. At this time, the voltage stored in the anode of the organic light emitting diode (OLED) is confirmed through the initialization voltage line 173 (the sensing period), and then the voltage of the anode of the organic light emitting diode is changed into the initialization voltage Vint to be initialized. (Initialization period)

When the characteristic of the driving transistor T1 changes while the driving transistor T1 disposed at each pixel PX has different threshold voltages Vth due to a process dispersion or is operated during a long term by the sensing period, this change is sensed so that the organic light emitting diode (OLED) normally emits light.

Next, during a data writing period, the scan signal Sn of a high level is supplied to the pixel PX through the scan line 151. The second transistor T2 is turned on by the scan signal Sn of a high level. If the second transistor T2 is turned on, the data voltage Dm is input to the gate electrode of the driving transistor T1 via the second transistor T2, and is stored to one side electrode of the storage capacitor Cst.

The turned-on degree of the driving transistor T1 is determined according to the data voltage Dm applied to the gate electrode, and it outputs the driving voltage ELVDD which is input to the first electrode to be transmitted to the anode of the organic light emitting diode (OLED).

The voltage of the anode of the organic light emitting diode (OLED) is stored in the overlapping capacitor or the first and second additional capacitors Ca and Cb as well as the storage capacitor Cst, and is maintained during one frame period.

In the above, the circuit structure was mainly described through FIG. 1.

Hereinafter, how the pixel PX according to an exemplary embodiment is implemented is described with reference to FIG. 3 to FIG. 5.

Figure 3:
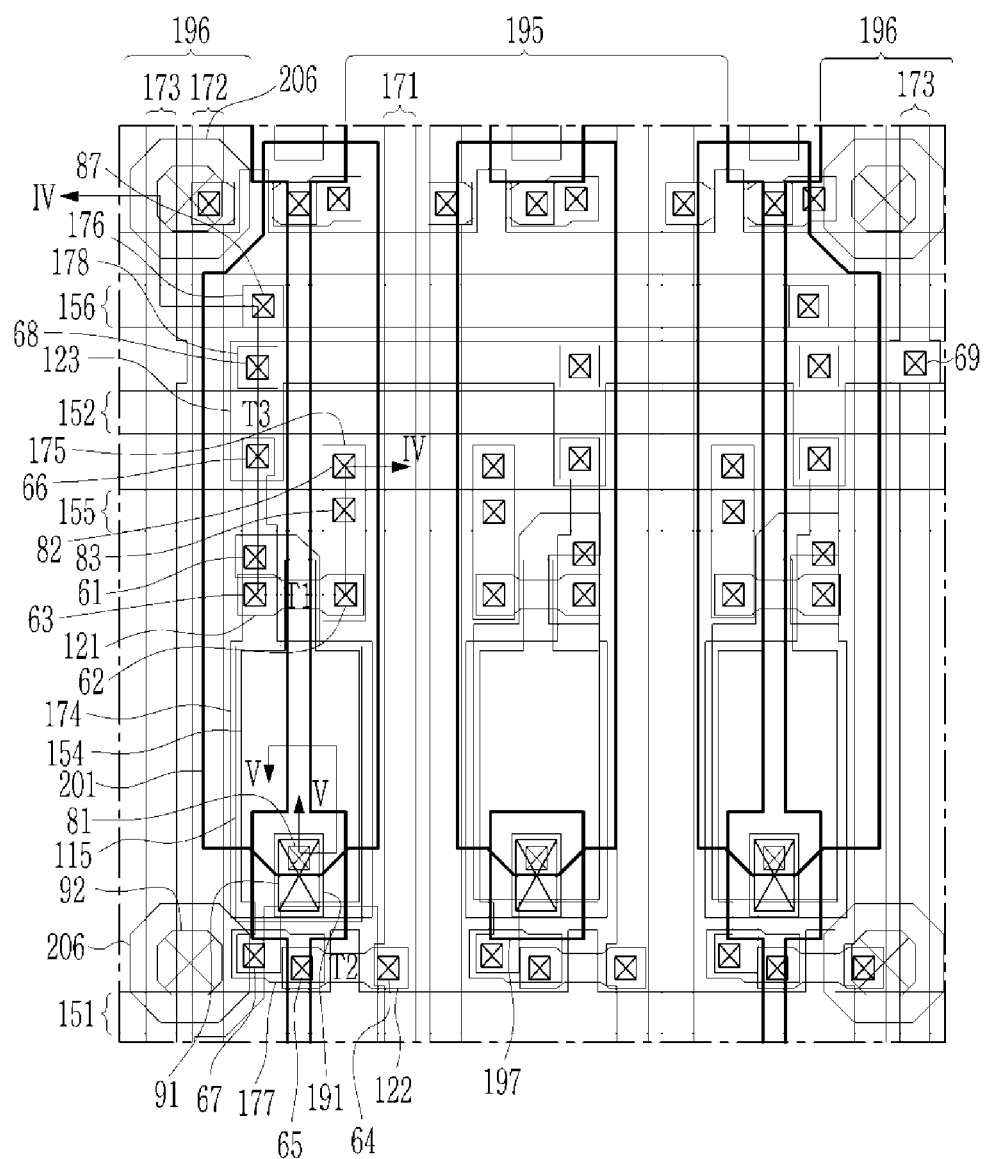
FIG. 3 is a layout view of a region of one pixel of an organic light emitting diode display according to an exemplary embodiment of the inventive concept.
Figure 4:
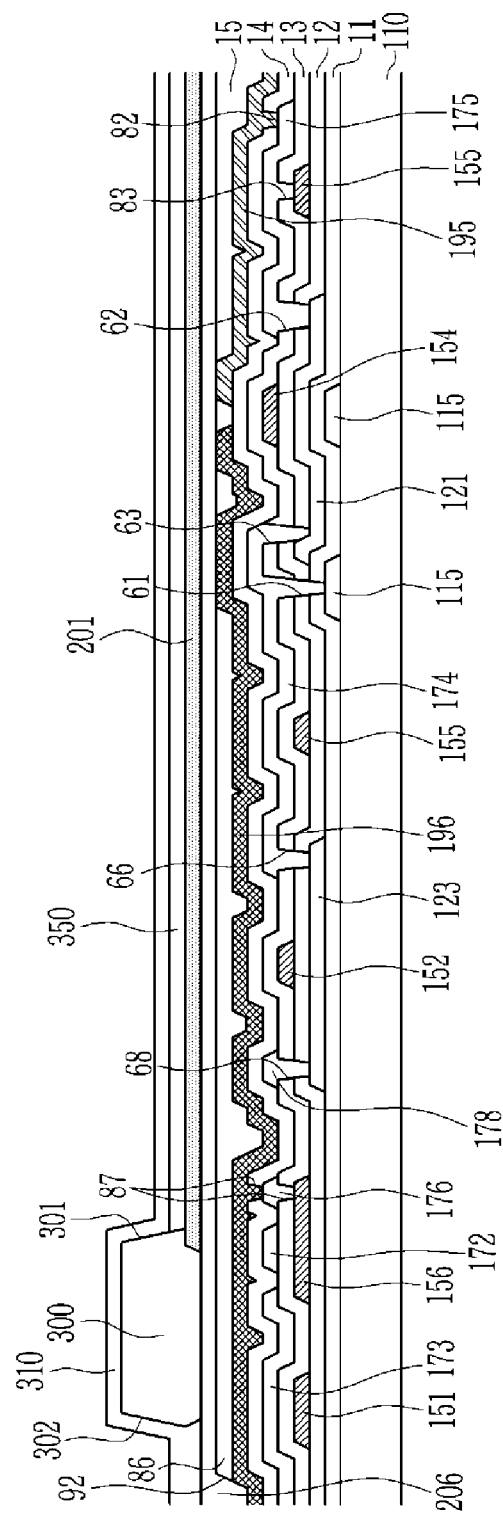
FIG. 4 and FIG. 5 are a cross-sectional view taken along lines IV-IV and V-V in an exemplary embodiment of FIG. 3.
Figure 5:
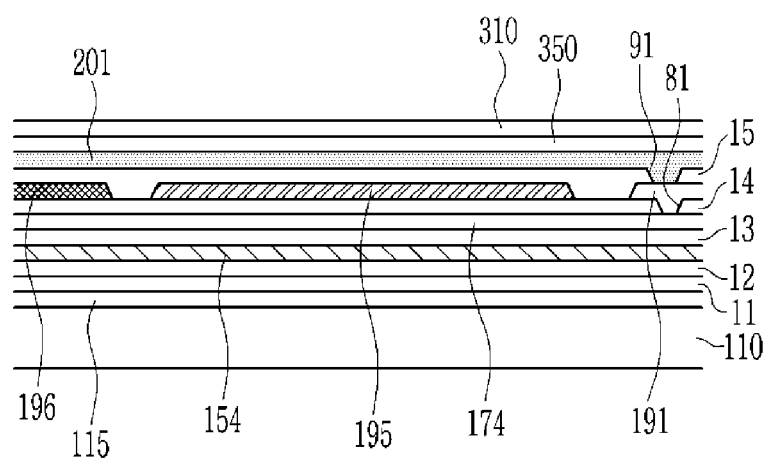

FIG. 3 is a layout view of a region of one pixel of an organic light emitting diode display according to an exemplary embodiment of the inventive concept, and FIG. 4 and FIG. 5 are a cross-sectional view taken along lines IV-IV and V-V in an exemplary embodiment of FIG. 3.

Referring to FIG. 3 to FIG. 5, in the organic light emitting diode display according to an exemplary embodiment of the inventive concept, the overlapping layer 115, a semiconductor layer (121, 122, and 123), a gate layer (151, 152, 154, 155, and 156), a first data layer (171, 172, 173, 174, 175, 176, 177, and 178), a second data layer (191, 195, and 196), a pixel electrode layer (201 and 206), an organic emission layer 350, and a cathode 310 are respectively formed on the substrate 110, and these layers are insulated from each other by an insulating layer between them unless they are connected by an opening.

The substrate 110 may be formed as a glass substrate or a flexible substrate containing plastic or polyimide (PI). When the substrate 110 is formed as the flexible substrate, unlike the case of the glass substrate, an additional inorganic insulating layer may be further formed.

The overlapping layer 115 formed on the substrate 110 is now described. The overlapping layer 115 includes a channel overlapping part overlapping the channel of the driving transistor T1, an extension part disposed under the storage capacitor Cst, and a connection part. The extension part of the overlapping layer 115 overlaps the extension part of a later-described gate electrode 154 to form the overlapping capacitor. The connection part of the overlapping layer 115 is connected to a later-described storage electrode 174 to receive the voltage of the anode. As a result, the overlapping capacitor holding the voltage of the anode is configured.

A buffer layer 11 covers the substrate 110 and the overlapping layer 115. The buffer layer 11 may be formed of the inorganic insulating material.

The semiconductor layer (121, 122, and 123) is formed on the buffer layer 11. Each semiconductor layer (121, 122, and 123) includes the channels of the driving transistor T1, the second transistor T2, and the third transistor T3. The semiconductor layer (121, 122, and 123) according to a present exemplary embodiment is formed of an oxide semiconductor. Each semiconductor layer (121, 122, and 123) includes the channel of each transistor T1, T2, and T3 and a source/drain region disposed on both sides of the channel. The source/drain region of each semiconductor layer (121, 122, and 123) is respectively extended and electrically connected to a different layer through an opening. The third semiconductor 123 including the channel of the third transistor T3 includes an extending part extending in the first direction (a transverse direction). The third semiconductor 123 of the third transistor T3 further includes a protrusion protruded from the extending part. That is, the extending part of the third semiconductor 123 is protruded to be connected to the third semiconductor 123 of the third transistor T3 of the adjacent pixel PX and extends to a position where the initialization voltage line 173 is formed. In the present exemplary embodiment, one initialization voltage line 173 is formed for three pixels PX, and the third semiconductors 123 of the third transistors T3 of three pixels PX are connected to each other to receive the initialization voltage Vint. Here, the extending part of the third semiconductor 123 may be doped to have the same characteristic as a conductor. On the other hand, according to an exemplary embodiment, the extending part of the third semiconductor 123 may be formed through a conductive layer other than the semiconductor layer such as a gate layer.

A gate insulating layer 12 covers the semiconductor layer (121, 122, and 123) and the buffer layer 11. The gate insulating layer 12 may be formed of the inorganic insulating material.

The gate layer (151, 152, 154, 155, and 156) is formed on the gate insulating layer 12. The gate layer includes the scan line 151, the previous scan line 152, the gate electrode 154 of the driving transistor T1, the first driving voltage line 155, and the first driving low voltage line 156.

The scan line 151 extends in the first direction (transverse direction), and includes a protrusion protruding toward a second semiconductor 122 where the channel of the second transistor T2 is disposed. The protrusion of the scan line 151 is the gate electrode of the second transistor T2.

The previous scan line 152 extends in the first direction (the transverse direction), and passes through the portion of the third semiconductor 123 where the channel of the third transistor T3 is disposed. The part where the previous scan line 152 meets the third semiconductor 123 is the gate electrode of the third transistor T3. However, according to an exemplary embodiment, the previous scan line 152 may further include a structure protruded toward the third semiconductor 123.

The first driving voltage line 155 and the first driving low voltage line 156 extend in the first direction (the transverse direction) as wiring for applying the driving voltage ELVDD and the driving low voltage ELVSS, respectively. The first driving voltage line 155 and the first driving low voltage line 156 respectively play a role of transmitting the driving voltage ELVDD and the driving low voltage ELVSS in the first direction. Hereinafter, the first driving voltage line 155 and the first driving low voltage line 156 are also referred to as a transverse driving voltage line and a transverse driving low voltage line, respectively.

The gate electrode 154 of the driving transistor T1 includes the overlapping part overlapping a first semiconductor 121 in which the channel of the driving transistor T1 is disposed and the extension part extending from the overlapping part. The overlapping part of the gate electrode 154 of the driving transistor T1 performs the role of the gate electrode, and the extension part forms one side electrode of the storage capacitor Cst. The extension part of the gate electrode 154 overlaps the extension part of the overlapping layer 115 to form the overlapping capacitor. The gate electrode 154 further includes an extending part extending from the extension part, and receives the data voltage Dm from the second electrode of the second transistor T2 through the extending part.

A first interlayer insulating layer 13 covers the gate layer (151, 152, 154, 155, and 156) and the gate insulating layer 12. The first interlayer insulating layer 13 may be formed of the inorganic insulating material.

The first data layer (171, 172, 173, 174, 175, 176, 177, and 178) is formed on the first interlayer insulating layer 13. The first data layer includes the pair of data lines 171 and 172, the initialization voltage line 173, the storage electrode 174, a driving voltage connection part 175, a driving low voltage connection part 176, a gate electrode connection part 177, and a step removing part 178.

The pair of data lines 171 and 172 are formed for each pixel column, and extend in a second direction (a longitudinal direction) perpendicular to the first direction. The pair of data lines 171 and 172 are arranged on both sides with respect to the position where the transistors T1, T2, and T3 are formed. One of the pair of data lines 171 and 172 is connected to the second semiconductor 122 of the second transistor T2 through an opening 64, and applies the data voltage Dm to the second transistor T2.

The initialization voltage line 173 is extended to the second direction like the pair of data lines 171 and 172, and applies the initialization voltage Vint. The initialization voltage line 173 is not formed for every pixel column, and one initialization voltage line 173 is formed for every three pixel columns in the present exemplary embodiment. The initialization voltage line 173 is connected to the extending part of the third semiconductor 123 through an opening 69. The third semiconductor 123 is connected to the third transistor T3 of each pixel PX by the protrusion to sense or initialize the voltage (i.e., the voltage of the anode) of the second electrode of the third transistor T3 of each pixel PX.

The storage electrode 174 has the extension part overlapping the extension part of the gate electrode 154, and includes the extending part extending from the extension part. The extending part of the storage electrode 174 is connected to the second electrode (the output side electrode) of the driving transistor T1, the overlapping layer 115, and the second electrode of the third transistor through openings 63, 61, and 66, respectively. The extension part of the storage electrode 174 overlaps the gate electrode 154 to form the storage capacitor Cst. As shown in FIG. 3, the extension part of the storage electrode 174 and the extension part of the gate electrode 154 occupy a large area within the pixel PX, but the area where the pixel PX is formed is reduced while increasing the resolution, therefore the capacitance of the storage capacitor Cst may be insufficient. To prevent this problem, the overlapping capacitor may be formed by adding the extension part of the overlapping layer 115 overlapping the extension part of the gate electrode 154. In addition, at least one of the additional capacitors Ca and Cb to be discussed below is additionally formed. In an exemplary embodiment, the storage electrode 174 is also electrically connected to the anode described later, so that the voltage of the storage electrode 174 is equal to the voltage of the anode and is initialized every frame period.

The driving voltage connection part 175 as a connection part that applies the driving voltage ELVDD to the first semiconductor 121 of the driving transistor T1 has an island structure. The driving voltage connection part 175 is connected to the first driving voltage line 155 through an opening 83, and is connected to the first semiconductor 121 through an opening 62. Also, the driving voltage connection part 175 extends upward and is connected to the second driving voltage line 195 described later through an opening 82.

In an exemplary embodiment, the driving low voltage connection part 176 has a linear structure, and facilitates the connection between the second driving low voltage line 196 and the first driving low voltage line 156, which will be described later. That is, the gate layer includes the first driving low voltage line 156, the second data layer includes the second driving low voltage line 196, and the first data layer includes the driving low voltage connection part 176 which is disposed between the gate layer and the second data layer. This structure improves a contact characteristic. According to an exemplary embodiment, the driving low voltage connection part 176 is omitted.

The gate electrode connection part 177 plays a role of electrically connecting the second electrode of the second transistor T2 and the gate electrode 154 of the driving transistor T1. That is, the gate electrode connection part 177 is connected to the second semiconductor 122 of the transistor T2 through an opening 65, and is connected to the extending part of the gate electrode 154 through an opening 67. According to an exemplary embodiment, since the gate electrode 154 and the second semiconductor 122 may be directly connected, the gate electrode connection part 177 may be omitted.

The step removing part 178 has the island structure, and is electrically connected to the extending part of the third semiconductor 123 by an opening 68. The step removing part 178 is formed to prevent the overlying second driving voltage line 195 or the second driving low voltage line 196 from being disconnected by the step. According to an exemplary embodiment, the step removing part 178 may be in a floating state, however the step removing part 178 receives the initialization voltage Vint in the present exemplary embodiment.

A second interlayer insulating layer 14 covers the first data layer (171, 172, 173, 174, 175, 176, 177, and 178) and the first interlayer insulating layer 13. The second interlayer insulating layer 14 may be formed of the inorganic insulating material.

A second data layer (191, 195, and 196) is formed on the second interlayer insulating layer 14. The second data layer includes an anode connection part 191, the second driving voltage line 195, and the second driving low voltage line 196.

The anode connection part 191 has the island structure, and is connected to the storage electrode 174 by an opening 81. Since the storage electrode 174 is connected to the second electrode (the output side electrode) of the driving transistor T1 to be electrically connected to the anode, which is one side electrode of the organic light emitting diode (OLED), the anode connection part 191 is formed for this.

The second driving voltage line 195 extends in the second direction (the longitudinal direction) to transmit the driving voltage ELVDD in the second direction. In an embodiment, the second driving voltage line 195 is wider than the width of one pixel PX. The second driving voltage line 195 is connected to the driving voltage connection part 175 through the opening 82, and connected to the first driving voltage line 155 through the driving voltage connection part 175. Hereinafter, the second driving voltage line 195 is referred to as the longitudinal driving voltage line. In an exemplary embodiment, the second driving voltage line 195 is formed except at the region where the anode connection part 191 is formed according to the position, and has an opening 197 (hereinafter also referred to as an anode connection part opening) corresponding to the anode connection part 191. The second driving voltage line 195 has the structure of which the width is reduced at the portion where the anode connection part 191 is disposed. In an embodiment, the width of the second driving voltage line 195 is greater than the width of the anode 201 formed thereon.

In an exemplary embodiment, the driving voltage ELVDD has a constant voltage, which is applied by the first driving voltage line 155 in the horizontal direction and by the second driving voltage line 195 in the longitudinal direction, so that the constant voltage is applied at each pixel PX.

The second driving low voltage line 196 is extended in the second direction (the longitudinal direction) to transmit the driving low voltage ELVSS in the second direction, and is spaced apart from the second driving voltage line 195 by a certain distance. Hereinafter, the second driving low voltage line 196 is also referred to as a longitudinal driving low voltage line. The second driving low voltage line 196 is connected to the driving low voltage connection part 176 and the first driving low voltage line 156 through an opening 87. Referring to FIG. 4, the opening 87 is collectively referred to as two openings formed at the same location, where the first opening 87 connects the first driving low voltage line 156 and the driving low voltage connection part 176, and the second opening 87 connects the driving low voltage connection part 176 and the second driving low voltage line 196.

In an exemplary embodiment, the second driving low voltage line 196 has a width that is equal to the width of one anode 201. In an exemplary embodiment, the second driving low voltage line 196 has a width that is greater than at least half of the width of the anode 201. In addition, the second driving low voltage line 196 has the structure in which the width is partially reduced at the portion where the anode connection part 191 is disposed.

In an exemplary embodiment, the driving low voltage ELVSS has a constant voltage, which is applied by the first driving low voltage line 156 in the horizontal direction and by the second driving low voltage line 196 in the longitudinal direction, so that the constant voltage may be applied at each pixel PX.

An upper insulating layer 15 is formed on the second data layer (191, 195, and 196) and the second interlayer insulating layer 14. The upper insulating layer 15 may be formed of an organic insulating material, and have a characteristic of removing and flattening the step.

The pixel electrode layer is disposed on the upper insulating layer 15, and the pixel electrode layer includes the anode 201 and a cathode connection part 206.

The anode 201 as one side electrode of the organic light emitting diode (OLED) transmits the current output from the driving transistor T1 to the organic emission layer 350. In order to receive the output current from the driving transistor T1, the anode 201 is connected to the anode connection part 191 by an opening 91 and is connected with the storage electrode 174 by the opening 81. The size and shape of the anode 201 may be different for each adjacent pixel PX.

The cathode connection part 206 is a connection part that allows the driving low voltage ELVSS to be applied to the cathode 310, which is the other side electrode of the organic light emitting diode (OLED). The cathode connection part 206 is electrically connected to the second driving low voltage line 196 through an opening 92, and is also electrically connected to the cathode 310 described later.

A partition 300 is formed between the adjacent anodes 201. The partition 300 has an opening 301 that exposes the anode 201, and the organic emission layer 350 may be disposed within the opening 301.

The cathode 310 is disposed on the organic emission layer 350 and the partition 300. The partition 300 further includes an opening 302 exposing the cathode connection part 206. The cathode 310 is connected to the cathode connection part 206 through the opening 302, and receives the driving low voltage ELVSS.

According to the above structure, the second driving voltage line 195 and the second driving low voltage line 196 are formed under and overlapped with anode 201. The part where the anode 201 overlaps the second driving voltage line 195 forms the first additional capacitor Ca, and the part where the anode 201 overlaps the second driving low voltage line 196 forms the second additional capacitor Cb.

Figure 6:
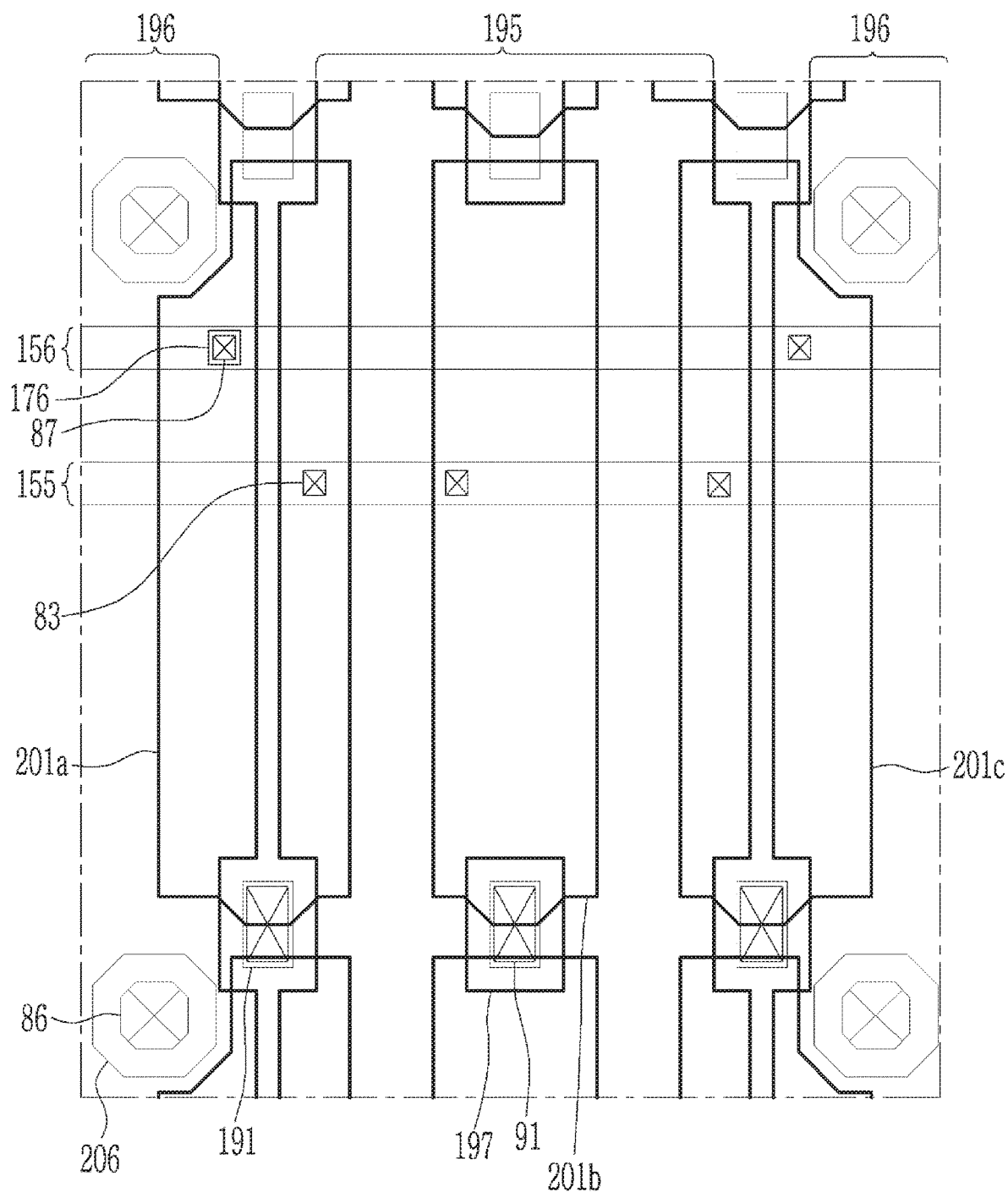
FIG. 6 is a layout view showing only a specific layer among one pixel of an organic light emitting diode display according to an exemplary embodiment of FIG. 3.

FIG. 3 to FIG. 5 are complex due to the different constituent elements, so the structure of the additional capacitors Ca and Cb is described through FIG. 6.

FIG. 6 is a layout view showing only a specific layer among one pixel of an organic light emitting diode display according to an exemplary embodiment of FIG. 3.

FIG. 6 mainly shows the second data layer and the pixel electrode layer, and the first driving voltage line 155 to which the driving voltage ELVDD is applied and the first driving low voltage line 156 to which the driving low voltage ELVSS is applied are additionally shown.

According to FIG. 6, the anode 201 has different areas for the adjacent pixels PX. The first pixel PX shown on the rightmost side has an anode 201a of which the edge width is reduced due to the cathode connection part 206, and the third pixel PX shown on the leftmost side has an anode 201c of which the edge width is reduced due to the cathode connection part 206. On the other hand, an anode 201b of the second pixel PX disposed at the middle has the angular structure of the corner portion. However, according to an exemplary embodiment, the central part of the anodes 201a and 201c of the first pixel PX and the third pixel PX are narrower than the anode 201b of the second pixel PX. The result thereof is that the capacitance of the additional capacitors of all pixels may be the same.

In addition, the second pixel PX disposed at the center of the three pixels has only the first additional capacitor Ca as the additional capacitor. That is, the anode 201b of the second pixel PX overlaps only the second driving voltage line 195, so that only the first additional capacitor Ca is formed. In an exemplary embodiment, a part of the anodes 201a and 201c of the first pixel and the third pixel overlaps the second driving low voltage line 196, and a part overlaps the second driving voltage line 195, thereby having both of the first and second additional capacitors Ca and Cb.

However, all three pixels may have additional capacitors Ca and Cb to compensate for the problem of decreasing the capacity of the storage capacitor Cst when the display is adjusted to a high resolution.

Referring to FIG. 6, the driving voltage ELVDD is applied with a mesh shape through the first driving voltage line 155 and the second driving voltage line 195, and the driving low voltage ELVSS is applied with the mesh shape through the first driving low voltage line 156 and the second driving low voltage line 196. As a result, even if the pixel PX is far from the part where the driving voltage ELVDD and the driving low voltage ELVSS are applied as the display device is large, the constant voltage may be applied.

Hereinafter, a variation exemplary embodiment of FIG. 3 is described with reference to FIG. 7 and FIG. 8.

In the exemplary embodiment of FIG. 7 and FIG. 8, unlike FIG. 3, there is a characteristic that an additional opening 198 (hereinafter also referred to as an opening for a parasitic capacitance) is formed in the second driving voltage line 195.

Figure 7:
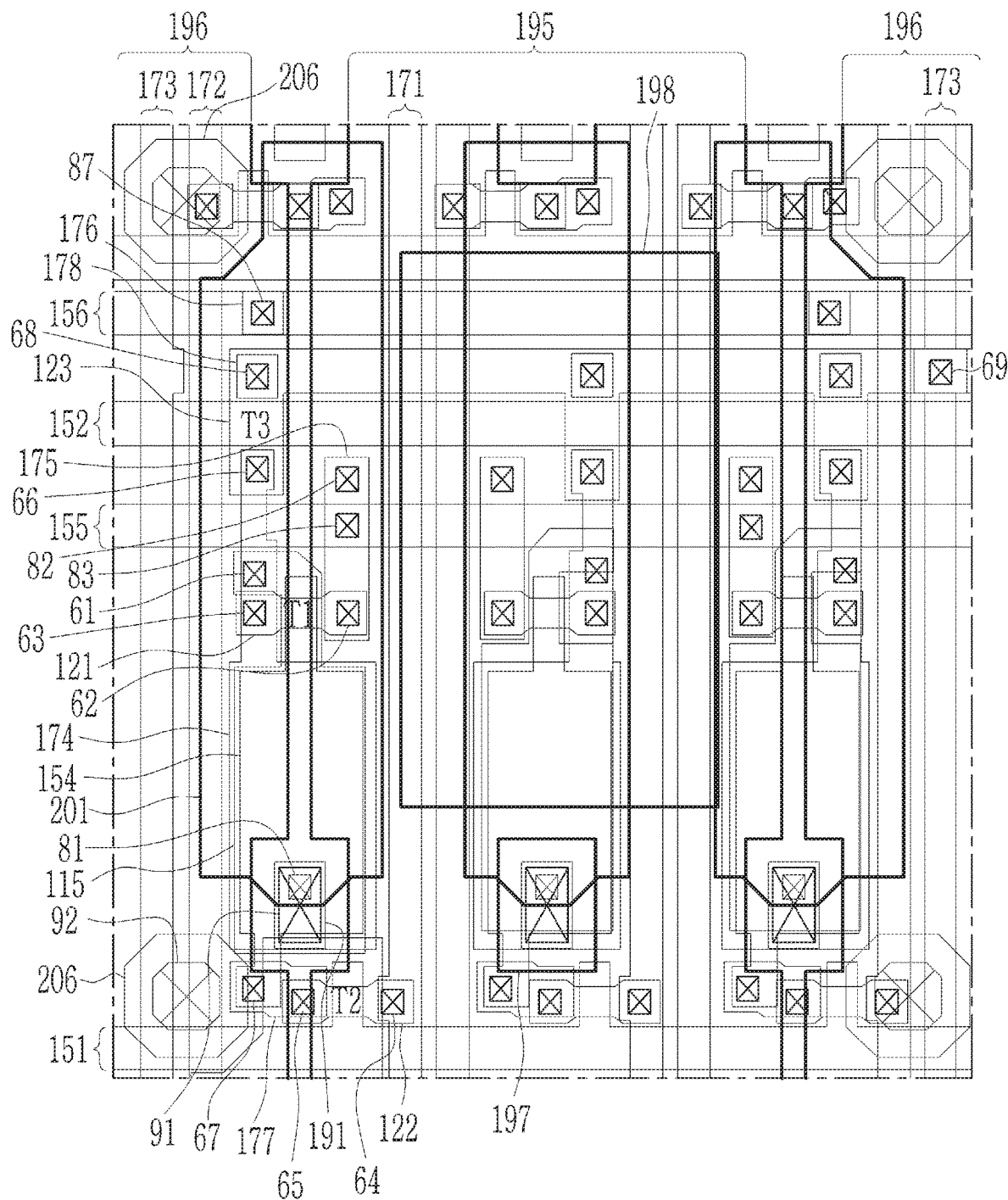
FIG. 7 is a layout view of a region of one pixel of an organic light emitting diode display according to another exemplary embodiment of the present inventive concept.
Figure 8:
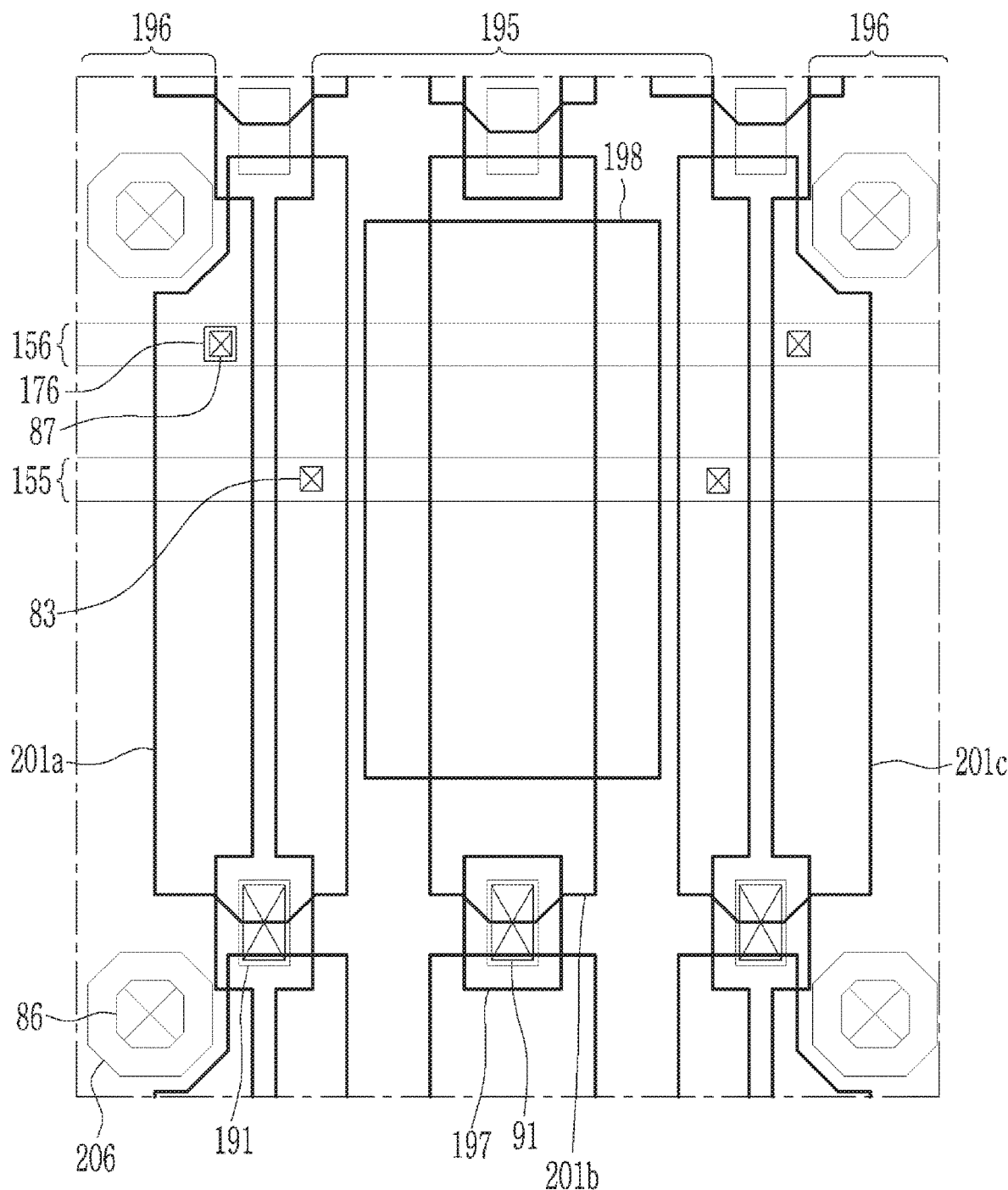
FIG. 8 is a layout view showing only a specific layer among one pixel of an organic light emitting diode display according to an exemplary embodiment of FIG. 7.

FIG. 7 is a layout view of a region of one pixel of an organic light emitting diode display according to an exemplary embodiment of the present inventive concept, and FIG. 8 is a layout view showing only a specific layer among one pixel of an organic light emitting diode display according to the exemplary embodiment of FIG. 7.

Referring to FIG. 8, the additional opening 198 is formed in the second driving voltage line 195 such that the overlapping area of the anode 201 and the second driving voltage line 195 is reduced. In such a case, there may be a drawback in which the capacitance of the first additional capacitor Ca is reduced. However, since the anode 201 overlaps the first data layer or the gate layer, a parasitic capacitance may be formed to compensate for an insufficient capacitance of the storage capacitor Cst. Also, in this case, the second driving voltage line 195 may reduce the signal delay problem caused by the parasitic capacitance caused by being overlapped with the first data layer or the gate layer.

According to an exemplary embodiment, the additional opening 198 formed in the second driving voltage line 195 may be replaced with a plurality of openings.

Further, according to an exemplary embodiment, the additional opening 198 is also formed in the second driving low voltage line 196.

As described above, the pixel PX of the organic light emitting diode display according to an exemplary embodiment of the inventive concept has the additional capacitors Ca and Cb, and may overcome the insufficient capacitance of the storage capacitor Cst due to the reduction of the pixel size due to the addition of the overlapping capacitors.

Hereinafter, the additional capacitor and the overlapping capacitor in another pixel structure will be described.

Figure 9:
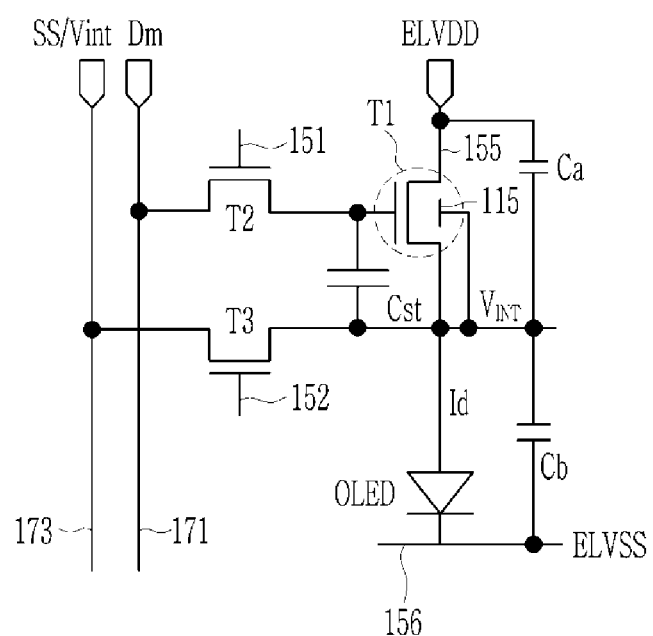
FIG. 9 is an equivalent circuit diagram of one pixel of an organic light emitting diode display according to an exemplary embodiment of the inventive concept.

FIG. 9 is an equivalent circuit diagram of one pixel of an organic light emitting diode display according to an exemplary embodiment of the inventive concept.

Referring to FIG. 9, the pixel PX of the organic light emitting diode display includes the plurality of transistors T1, T2, and T3, the storage capacitor Cst, the additional capacitors Ca and Cb, and the organic light emitting diode (OLED), which are connected to the several signal lines 151, 152, 171, 173, 155, and 156.

The organic light emitting diode display according to the exemplary embodiment of FIG. 9 shows an organic light emitting diode display that may be used in a high resolution of 4K. Unlike the exemplary embodiment of FIG. 1, only one data line 171 is formed for one pixel row. In addition, the scan line 151 does not constitute a pair of scan lines receiving the same signal, so only one scan line receives the signal.

The plurality of transistors T1, T2, and T3 included in one pixel PX include the driving transistor T1, include the switching transistor T2 (i.e., the second transistor) connected to the scan line 151, and the initialization transistor T3 (i.e., the third transistor or the sensing transistor) connected to the previous scan line 152. The third transistor may be connected to the signal line that applies the gate-on voltage at different timing from the previous scan line 152.

The plurality of signal lines 151, 152, 171, 173, 155, and 156 included in one pixel PX may include the scan line 151, the previous scan line 152, the data line 171, the initialization voltage line 173 (referred to as the sensing line), the driving voltage line 155, and the driving low voltage line 156.

The scan line 151 is connected to a gate driver (not shown) to transfer the scan signal Sn to the second transistor T2.

The previous scan line 152 is connected to the gate driver, and transfer the previous scan signal S(n−1) applied to the pixel PX disposed at a previous stage to the third transistor T3.

The data line 171 is a wire for transferring the data voltage Dm generated from the data driver (not shown), and one data line 171 is formed for one pixel column. One data line 171 and one scan line 151 select one pixel to input the data voltage Dm. The luminance emitted by the organic light emitting diode (OLED, referred to as an organic light emitting element) is changed depending on the data voltage Dm provided to the pixel PX.

The driving voltage line 155 applies the driving voltage ELVDD and the driving low voltage line 156 applies the driving low voltage ELVSS. The driving voltage line 155 and the driving low voltage line 156 according to the present exemplary embodiment are wires extending in the longitudinal direction, and are called a longitudinal driving voltage line and a longitudinal driving low voltage line, respectively. In an exemplary embodiment, the voltages applied to the driving voltage line 155 and the driving low voltage line 156 are constant voltages. The driving voltage ELVDD performs a role of the input voltage for generating the output current in the driving transistor T1, and when the output current is applied to the anode electrode of the organic light emitting diode (OLED), the driving low voltage ELVSS is applied to the cathode electrode of the OLED.

Hereinafter, a plurality of transistors will be described.

First, the driving transistor T1 is a transistor controlling the magnitude of the current output according to the data voltage Dm applied to the gate electrode, thereby the output driving current Id is applied to the organic light emitting diode (OLED) and the brightness of the organic light emitting diode (OLED) is controlled depending on the data voltage Dm. For this purpose, the first electrode (the input side electrode) of the driving transistor T1 is disposed to receive the driving voltage ELVDD, and the second electrode (the output side electrode) is connected to the first electrode (hereinafter referred to as the anode or the pixel electrode) of the organic light emitting diode (OLED). In addition, the gate electrode of the driving transistor T1 is connected to the second electrode (the output side electrode) of the second transistor T2 to receive the data voltage Dm.

In an exemplary embodiment, the gate electrode of the driving transistor T1 is connected to one electrode of the storage capacitor Cst. The storage capacitor Cst ensures that the data voltage Dm transmitted to the gate electrode of the driving transistor T1 is maintained for one frame period. Therefore, the voltage of the gate electrode of the driving transistor T1 changes according to the voltage stored in the storage capacitor Cst, and accordingly the driving current Id output from the driving transistor T1 is changed, and is constantly output for one frame period.

Also, the driving transistor T1 according to an exemplary embodiment further includes the overlapping layer 115 under the semiconductor layer in which the channel is disposed. The overlapping layer 115 overlaps the channel and the gate electrode of the driving transistor T1, thereby playing a role of improving a characteristic of the driving transistor T1 and maintaining the voltage of the gate electrode. Since the overlapping layer 115 overlaps the gate electrode, the voltage of the gate electrode is maintained, thereby supplementing the capacitance of the storage capacitor Cst. Hereinafter, a capacitor formed by an overlapping between the overlapping layer 115 and the gate electrode of the driving transistor T1 is referred to as an overlapping capacitor (not shown). The overlapping layer 115 is electrically connected to the second electrode (the output side electrode) of the driving transistor T1, and as a result, the overlapping layer 115 is also connected to the anode of the resultant organic light emitting diode (OLED).

The second transistor T2 (hereinafter referred to as the switching transistor) is a transistor that receives the data voltage Dm as input into the pixel PX. The gate electrode of the second transistor T2 is connected to the scan line 151, the first electrode of the second transistor T2 is connected to the data line 171, and the second electrode (the output side electrode) of the second transistor T2 is connected to the gate electrode of the driving transistor T1. If the second transistor T2 is turned on depending on the scan signal Sn transmitted through the scan line 151, the data voltage Dm transmitted through the data line 171 is transmitted to the gate electrode of the driving transistor T1 and is stored to the storage capacitor Cst.

The third transistor T3 (hereinafter referred to as the initialization transistor or the sensing transistor) plays a role of initializing the second electrode (the output side electrode) of the driving transistor T1, one electrode of the storage capacitor Cst, and the anode of the organic light emitting diode (OLED). The gate electrode of the third transistor T3 is connected to the previous scan line 152, and the first electrode of the third transistor T3 is connected to the initialization voltage line 173. The second electrode of the third transistor T3 is electrically connected to the second electrode (the output side electrode) of the driving transistor T1, and as a result, is also connected to the anode and overlapping layer 115 of the organic light emitting diode (OLED) and the overlapping layer 115.

The initialization voltage line 173 provides not only the initialization voltage, but is also used as a wire (e.g., a sensing wire) for sensing the voltage of the anode of the OLED connected to the second electrode of the third transistor T3 during a sensing period. As a result, the third transistor T3 is also referred to as a sensing transistor.

The operation of the third transistor T3 is now described. The voltage of the anode of the OLED when the organic light emitting diode (OLED) emits light during an emitting period is stored on one electrode of the storage capacitor Cst. At this time, the data voltage Dm is stored in the other electrode of the storage capacitor Cst. At this time, if the gate-on voltage is applied to the gate electrode of the third transistor T3, the initialization voltage line 173 operates as a sensing line, and the voltage of the anode is transmitted to a sensing unit (not shown) through the sensing line. Hereinafter, this is referred to as the sensing period. Next, during reset period among a period in which the gate-on voltage is applied to the gate electrode of the third transistor T3, the initialization voltage line 173 applies the initialization voltage Vint to initialize the voltage of the anode. Hereinafter, this is referred to as the initialization period.

If the voltage detected in the sensing period is different from the voltage of the anode that is expected when it is determined based on the applied data voltage Dm, the data voltage Dm may be modified to be provided to the pixel PX. That is, the characteristic of the driving transistor T1 may be changed, and the organic light emitting diode (OLED) may emit normal light by sensing the change and providing the data voltage Dm corresponding thereto.

That is, two electrodes of the storage capacitor Cst may play a role of maintaining the data voltage Dm and the voltage of the anode (the output electrode voltage of the driving transistor) of the organic light emitting diode (OLED) during one frame.

Since the area occupied by a pixel PX and the area for forming a storage capacitor Cst in the pixel PX is small in an organic light emitting diode display of a high resolution, an insufficient storage capacitance may be maintained for one frame period.

Therefore, the pixel PX of at least one exemplary embodiment of the inventive concept further includes first and second additional capacitors Ca and Cb so as to have sufficient storage capacitance to maintain the voltage of the anode of the organic light emitting diode (OLED) for one frame period.

The first additional capacitor Ca has one side electrode connected to the anode of the organic light emitting diode (OLED) and the other side electrode to which the driving voltage ELVDD is applied, thereby maintaining the voltage of the anode of the organic light emitting diode (OLED).

Also, since the second additional capacitor Cb has one side electrode connected to the anode of the organic light emitting diode (OLED) and the other side electrode to which the driving low voltage ELVSS is applied, the second additional capacitor Cb also plays a role of maintaining the voltage of the anode of the organic light emitting diode (OLED).

Therefore, the capacitor included in one pixel PX has the storage capacitor Cst and the additional capacitors Ca and Cb, thereby ensuring sufficient storage capacitance for maintaining the voltage of the anode of the organic light emitting diode (OLED) during one frame period. Also, according to an exemplary embodiment of the inventive concept, an overlapping capacitor formed by the overlapping layer 115 is further included.

The organic light emitting diode display according to the exemplary embodiment of FIG. 9 receives the same signals as in FIG. 2.

The operation of the pixel of FIG. 9 is now described with reference to FIG. 2.

First, during the sensing/initial period, the previous scan signal S(n−1) of a high level is supplied to the pixel PX through the previous scan line 152. Then, the third transistor T3 receiving the previous scan signal S(n−1) is turned on. At this time, the voltage stored in the anode of the organic light emitting diode (OLED) is confirmed through the initialization voltage line 173 (the sensing period), and then the voltage of the anode of the organic light emitting diode is changed into the initialization voltage Vint to be initialized. (Initialization period)

When the characteristic of the driving transistor T1 changes while the driving transistor T1 disposed at each pixel PX has different threshold voltages Vth due to a process dispersion or is operated during a long term by the sensing period, this change is sensed so that the organic light emitting diode (OLED) normally emits light.

Next, during the data writing period, the scan signal Sn of a high level is supplied to the pixel PX through the scan line 151. The second transistor T2 is turned on by the scan signal Sn of a high level. If the second transistor T2 is turned on, the data voltage Dm is input to the gate electrode of the driving transistor T1 via the second transistor T2, and is stored to one side electrode of the storage capacitor Cst.

The turned-on degree of the driving transistor T1 is determined according to the data voltage Dm applied to the gate electrode, and it outputs the driving voltage ELVDD which is input to the first electrode to be transmitted to the anode of the organic light emitting diode (OLED).

The voltage of the anode of the organic light emitting diode (OLED) is stored in the additional capacitors Ca and Cb or the overlapping capacitor as well as the storage capacitor Cst, and is maintained during one frame period.

In the above, the circuit structure was mainly described through FIG. 9.

Hereinafter, how the pixel PX according to an exemplary embodiment is implemented is described with reference to FIG. 10 to FIG. 12.

Figure 10:
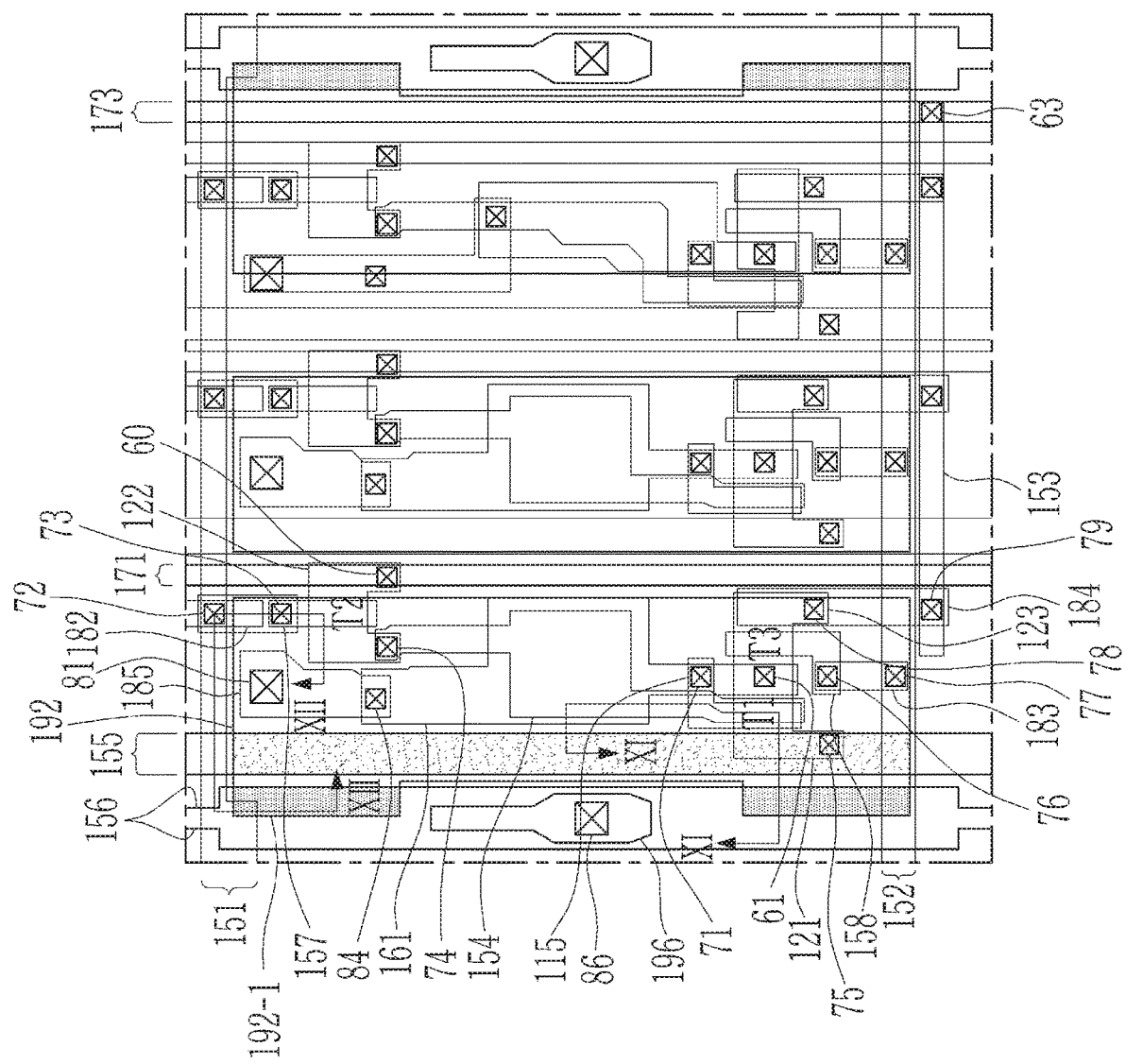
FIG. 10 is a layout view of a region of one pixel of an organic light emitting diode display according to an exemplary embodiment of the present inventive concept.
Figure 11:
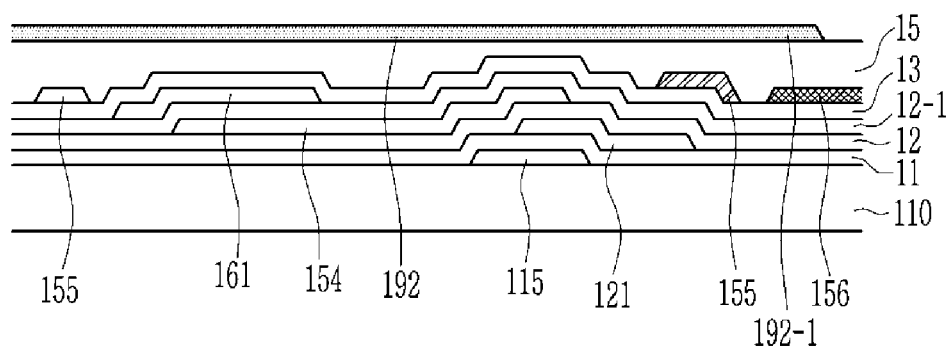
FIG. 11 and FIG. 12 are a cross-sectional view taken along lines XI-XI and XII-XII in an exemplary embodiment of FIG. 10.
Figure 12:
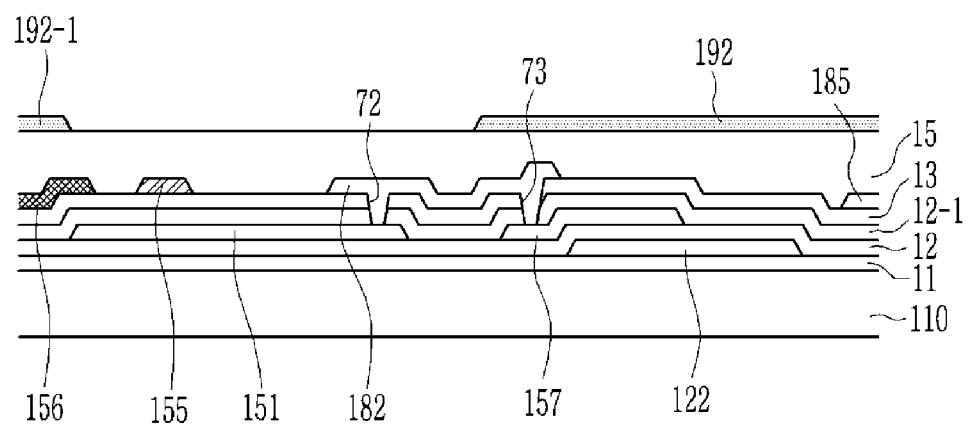

FIG. 10 is a layout view of a region of one pixel of an organic light emitting diode display according to an exemplary embodiment of the inventive concept, and FIG. 11 and FIG. 12 are cross-sectional views taken along lines XI-XI and XII-XII in an exemplary embodiment of FIG. 10.

Referring to FIG. 10 to FIG. 12, in the organic light emitting diode display according to an exemplary embodiment, the overlapping layer 115, the semiconductor layer (121, 122, and 123), the gate layer (151, 152, 153, 154, 157, and 158), a second gate layer (the storage electrode 161), the first data layer (171, 173, 155, 156, 182, 183, 184, and 185), the pixel electrode layer (192, 192-1, and 196), the organic emission layer (not shown), and the common electrode (not shown) are formed on the substrate 110, respectively, and these layers are insulated from each other by an insulating layer between them unless they are connected by an opening.

The substrate 110 may be formed as a glass substrate or a flexible substrate containing plastic or polyimide (PI). When the substrate 110 is formed as the flexible substrate, unlike the case of the glass substrate, an additional inorganic insulating layer may be further formed.

The overlapping layer 115 formed on the substrate 110 is now described. The overlapping layer 115 includes an overlapping part overlapping the channel of the driving transistor T1 and a connection part. The connection part of the overlapping layer 115 is connected to a later-described storage electrode 161. Since the storage electrode 161 has the voltage of the anode of an OLED, the overlapping layer 115 also has the voltage of the anode.

The buffer layer 11 covers the substrate 110 and the overlapping layer 115. The buffer layer 11 may be formed of the inorganic insulating material.

The semiconductor layer (121, 122, and 123) is formed on the buffer layer 11. Each semiconductor layer (121, 122, and 123) includes the channels of the driving transistor T1, the second transistor T2, and the third transistor T3. The semiconductor layer (121, 122, and 123) according to an exemplary embodiment is formed of an oxide semiconductor. Each semiconductor layer (121, 122, and 123) includes the channel of each transistor T1, T2, and T3, and the source/drain region disposed on both sides of the channel. The source/drain region of each semiconductor layer (121, 122, and 123) is respectively extended and electrically connected to the different layer through the opening.

The gate insulating layer 12 covers the semiconductor layer (121, 122, and 123) and the buffer layer 11. The gate insulating layer 12 may be formed of an inorganic insulating material.

The gate layer (151, 152, 153, 154, 157, and 158) is formed on the gate insulating layer 12. The gate layer includes the scan line 151, the previous scan line 152, an initialization voltage transmitting part 153, the gate electrode 154 of the driving transistor T1, a gate electrode 157 of the second transistor T2, and a gate electrode 158 of the third transistor T3.

The scan line 151 extends in the first direction (the transverse direction), and the previous scan line 152 also extends in the first direction (the transverse direction).

The initialization voltage transmitting part 153 has a long island shape in the first direction. The initialization voltage transmitting part 153 is a structure for connecting the initialization voltage line 173 formed for a predetermined number of pixel columns and a plurality of pixels. That is, the initialization voltage transmitting part 153 passes an adjacent pixel PX and extends to a position where the initialization voltage line 173 is formed. In the present exemplary embodiment, one initialization voltage line 173 is formed for each three pixels PX.

The gate electrode 154 of the driving transistor T1 includes an overlapping part overlapping the first semiconductor 121 in which the channel of the driving transistor T1 is disposed, an extension part extended from the overlapping part, and an extending part connected to the second semiconductor 122 of the second transistor T2. In an exemplary embodiment, only the overlapping part of the gate electrode 154 of the driving transistor T1 performs the role of the gate electrode, and the extension part forms one side electrode of the storage capacitor Cst. The extension part of the gate electrode 154 overlaps the extension part of the overlapping layer 115 to form an overlapping capacitor. The extending part of the gate electrode 154 is connected to the second semiconductor 122 of the second transistor T2 through an opening 74, and receives the data voltage Dm from the second electrode of the second transistor T2.

The gate electrode 157 of the second transistor T2 has the island structure, and overlaps the second semiconductor 122 of the second transistor T2. The channel of the second transistor T2 is formed at the position where the second semiconductor 122 and the gate electrode 157 overlap. The gate electrode 157 is electrically connected to the scan line 151 through the second gate electrode connection part 182.

The gate electrode 158 of the third transistor T3 has the island structure, and overlaps the third semiconductor 123 of the third transistor T3. The channel of the third transistor T3 is formed at the position where the third semiconductor 123 and the gate electrode 158 overlap. The gate electrode 158 is electrically connected to the previous scan line 152 through a third gate electrode connection part 183.

A second gate insulating layer 12-1 covers the gate layer (151, 152, 153, 154, 157, and 158) and the gate insulating layer 12. The second gate insulating layer 12-1 may be formed of an inorganic insulating material.

The second gate layer is disposed on the second gate insulating layer 12-1, and the second gate layer includes the storage electrode 161.

The storage electrode 161 has the extension part overlapping the extension part of the gate electrode 154 of the driving transistor T1, and includes a first extending part and a second extending part respectively extending upward and downward from the extension part. The first extending part extending downward from the extension part of the storage electrode 161 is connected to the second electrode (the output side electrode) of the driving transistor T1 and the overlapping layer 115 through openings 61 and 71. The second extending part extending upward from the extension part of the storage electrode 161 is connected to the anode connection part 185 through an opening 84. The extension part of the storage electrode 161 overlaps the gate electrode 154 to form the storage capacitor Cst. The extension part of the storage electrode 161 and the extension part of the gate electrode 154 occupy a large area in the pixel PX, but the area where the pixel PX is formed with high resolution is reduced, resulting in a problem of insufficient capacitance of the storage capacitor Cst. To prevent this problem, the additional capacitors Ca and Cb are further formed, and the additional capacitor Cb is formed in the pixels disposed on both sides of FIG. 10. This is described later.

A first interlayer insulating layer 13 covers the second gate layer (the storage electrode 161) and the second gate insulating layer 12-1. The first interlayer insulating layer 13 may be formed of an inorganic insulating material.

The first data layer (171, 173, 155, 156, 182, 183, 184, and 185) is formed on the first interlayer insulating layer 13. The first data layer includes the data line 171, the initialization voltage line 173, the driving voltage line 155, the driving low voltage line 156, a second gate electrode connection part 182, the third gate electrode connection part 183, an initialization voltage second transmitting part 184, and an anode connection part 185.

The data line 171 is formed for each pixel column, and is extended in the second direction (the longitudinal direction) perpendicular to the first direction. The data line 171 is connected to the second semiconductor 122 of the second transistor T2 through an opening 60, and applies the data voltage Dm to the second transistor T2.

The initialization voltage line 173 is extended in the second direction and applies the initialization voltage Vint. The initialization voltage line 173 is not formed for every pixel column, and in the present exemplary embodiment, one initialization voltage line 173 is formed for three pixel columns. The initialization voltage line 173 is connected to the initialization voltage transmitting part 153 through the opening 63, and the initialization voltage transmitting part 153 is connected to the initialization voltage second transmitting part 184 through an opening 79. The initialization voltage second transmitting part 184 is connected to the third semiconductor 123 of the third transistor T3 via an opening 78. As a result, the initialization voltage Vint is applied to the first electrode of the third transistor T3 of each pixel.

The driving voltage line 155 and the driving low voltage line 156 extend in the second direction. The driving voltage line 155 is disposed per each pixel column, but the driving low voltage line 156 is disposed per three pixel columns. The driving voltage line 155 transmits the driving voltage ELVDD, and is connected to the first semiconductor 121 of the driving transistor T1 through an opening 75 to transmit the driving voltage ELVDD to the first electrode of the driving transistor T1. In an exemplary embodiment, the driving voltage line 155 has a narrow width as compared to the driving low voltage line 156. In addition, the driving low voltage line 156 may have a narrow width in a region overlapping the wiring disposed in another layer. In FIG. 10, the driving voltage line 155 has a narrow width at the portion overlapping the scan line 151. The driving low voltage line 156 having a wide width is for forming the structure that is electrically connected to transmit the driving low voltage ELVSS to the overlapping cathode electrode. That is, a certain level of width is required for being electrically connected by forming a contact by a laser or the like.

Although not shown in FIG. 10, the driving voltage line 155 may further include a transverse driving low voltage line (not shown). The transverse driving low voltage line is disposed between vertically adjacent pixels, and may be electrically connected to the driving voltage line 155.

The second gate electrode connection part 182 has the island shape, and overlaps the scan line 151 and the gate electrode 157 of the second transistor T2. The second gate electrode connection part 182 is connected to the scan line 151 and the gate electrode 157 of the second transistor T2 through openings 72 and 73, respectively, and transfers the scan signal Sn applied to the scan line 151 to the gate electrode 157 of the second transistor T2.

The third gate electrode connection part 183 has the island shape and overlaps the previous scan line 152 and the gate electrode 158 of the third transistor T3. The third gate electrode connection part 183 is connected to the gate electrode 158 of the third transistor T3 and the previous scan line 152 through openings 76 and 77, respectively, and transmits the previous scan signal S(n−1) applied to the previous scan line 152 to the gate electrode 158 of the third transistor T3.

The anode connection part 185 is connected to the second extending part of the storage electrode 161 through the opening 84, and is connected to the anode 192 through the opening 81. As a result, the output current of the driving transistor T1 is transmitted to the anode 192.

The upper insulating layer 15 is disposed on the first data layer (171, 173, 155, 156, 182, 183, 184, and 185) and the first interlayer insulating layer 13. The upper insulating layer 15 is formed of the organic insulating material, and has a characteristic of removing and flattening the step.

The pixel electrode layer is disposed on the upper insulating layer 15, and the pixel electrode layer includes the anode (192 and 192-1) and the cathode connection part 196.

The anode (192 and 192-1) as one side electrode of the organic light emitting diode (OLED) transmits the current output from the driving transistor T1 to the organic emission layer. To receive the output current from the driving transistor T1, the anode (192 and 192-1) is connected to the anode connection part 185 through the opening 81, and is connected to the storage electrode 161 through the opening 84.

Referring to FIG. 10, the anode (192 and 192-1) includes the part 192 overlapping the organic emission layer and the part 192-1 (hereinafter referred to as an additional capacitor extension part) passing above the driving voltage line 155 and extending above the driving low voltage line 156. The extended part 192-1 of the anode is formed except in the region where the cathode connection part 196 is disposed, overlaps the driving voltage line 155 to form the first additional capacitor Ca, and overlaps the driving low voltage line 156 to form the second additional capacitor Cb.

In FIG. 10, it is clearly shown that the anode (192 and, 192-1) has a different area for each adjacent pixel PX. The first pixel PX shown on the rightmost side has the extended part 192-1 of the anode of which the edge width is reduced due to the cathode connection part 196, and the third pixel PX shown on the leftmost side has the extended part 192-1 of the anode of which the edge width is reduced due to the cathode connection part 196. In an exemplary embodiment, the anode 192 of the second pixel PX disposed in the middle does not include the extended part of the anode. However, according to an exemplary embodiment, the central portion of the anode 192 of the first pixel PX and the third pixel PX is narrower than the anode 192 of the second pixel PX. As a result, the capacitance of the additional capacitors of all pixels may be the same.

However, since the driving low voltage line 156 is formed every three pixel columns, some pixels may not include the extended part 192-1 of the anode forming the additional capacitors Ca and Cb. Also, according to an exemplary embodiment, the driving low voltage line 156 is not disposed at the portion adjacent to the anode 192, and the anode 192 may extend only above the driving voltage line 155 to only form the first additional capacitor Ca in the pixel in which only the driving voltage line 155 is disposed.

According an exemplary embodiment, the anode 192 extends above the initialization voltage line 173 to form the additional capacitor.

The cathode connection part 196 is the connection part so that the driving low voltage ELVSS may be applied to the cathode of the other side electrode of the organic light emitting diode (OLED). The cathode connection part 196 is electrically connected to the driving low voltage line 156 through an opening 86.

Although not shown, a partition is formed between adjacent anode parts 192 and 192-1. The partition has an opening that exposes the anode (192 and 192-1), and the organic emission layer may be disposed within the opening.

In an embodiment, the cathode electrode of the OLED is disposed on the organic emission layer and the partition. The partition further includes the opening exposing the cathode connection part 196. The cathode is connected to the exposed cathode connection part 196 to receive the driving low voltage ELVSS.

According to the above structure, the extended part 192-1 of the anode and the driving low voltage line 156 overlap to form the additional capacitors Ca and Cb. According to an exemplary embodiment, capacitors may be formed by the overlapping of the extended part 192-1 of the anode and the initialization voltage line 173. As a result, the voltage of the anode may be maintained.

Next, an exemplary variation of the exemplary embodiment of FIG. 10 is described with reference to FIG. 13 and FIG. 14. In the exemplary embodiment of FIG. 13, unlike in FIG. 10, the driving low voltage line is formed as a dual layer.

Figure 13:
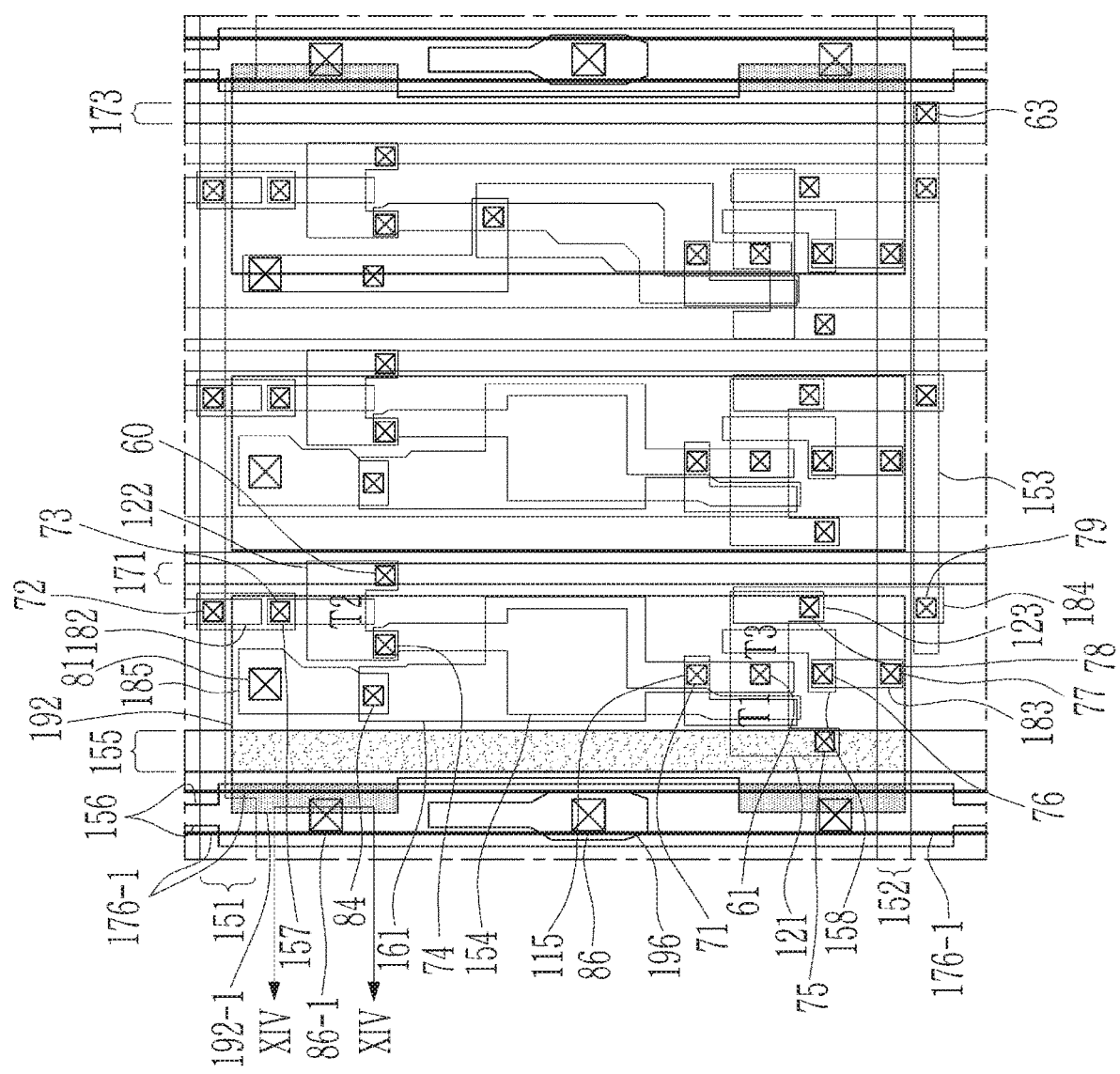
FIG. 13 is a layout view of a region of one pixel of an organic light emitting diode display according to an exemplary embodiment of the present inventive concept.
Figure 14:
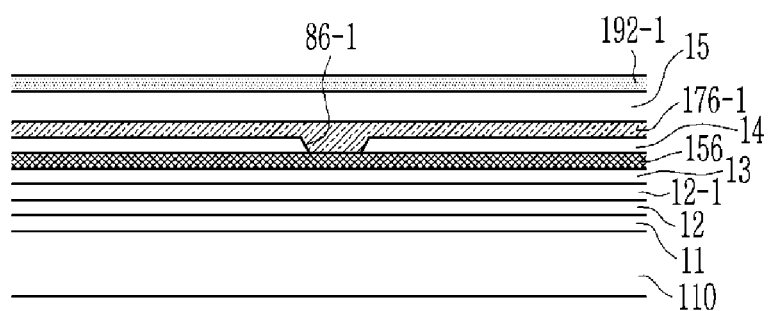
FIG. 14 is a cross-sectional view taken along a line XIV-XIV in an exemplary embodiment of FIG. 13.

FIG. 13 is a layout view of a region of one pixel of an organic light emitting diode display according to an exemplary embodiment of the present inventive concept, and FIG. 14 is a cross-sectional view taken along line XIV-XIV in an exemplary embodiment of FIG. 13.

The exemplary embodiment of FIG. 13 further includes a second data layer unlike the exemplary embodiment of FIG. 10, and it further includes a second interlayer insulating layer 14 to insulate the second data layer from other layers.

That is, a second interlayer insulating layer 14 covers the first data layer (171, 173, 155, 156, 182, 183, 184, and 185). The second interlayer insulating layer 14 may be formed of an inorganic insulating material.

The second data layer is formed on the second interlayer insulating layer 14, and the second data layer includes a second driving low voltage line 176-1.

The second driving low voltage line 176-1 overlaps the driving low voltage line 156 and extends in the second direction. The second driving low voltage line 176-1 and the driving voltage line 155 are connected through an opening 86-1. The second driving low voltage line 176-1 is also disposed per three pixel columns like the driving low voltage line 156. The second driving low voltage line 176-1 also transmits the driving voltage ELVDD, and eliminates various problems when transmitting the driving voltage ELVDD only by the driving low voltage line 156. That is, when only forming the driving low voltage line 156, the width thereof is reduced, unlike the exemplary embodiment FIG. 3, so the voltage drop due to the resistance may be eliminated. In the exemplary embodiment of FIG. 13, the driving low voltage line 156 is not formed of the mesh structure including the horizontal direction wiring and the longitudinal direction wiring, unlike the exemplary embodiment of FIG. 3, but is formed only in the longitudinal direction. In this case, even though a voltage drop occurs in the driving low voltage ELVSS, the voltage drop may be reduced by the dual layer structure. Also, the driving low voltage ELVSS can be applied through the other layer even if one set of wiring of the single layer is disconnected.

The upper insulating layer 15 is formed on the second data layer 176-1 and the second interlayer insulating layer 14 like in FIG. 10 to FIG. 12.

The exemplary embodiment of FIG. 13 not only stably transmits the driving low voltage ELVSS as compared with the exemplary embodiment of FIG. 10, but also further includes the second additional capacitor Cb like in FIG. 10, thereby compensating an insufficient capacitance of the storage capacitor Cst in a pixel of high resolution.

Next, a pixel of the organic light emitting diode display according to an exemplary embodiment of the inventive concept is described with reference to FIG. 15.

Figure 15:
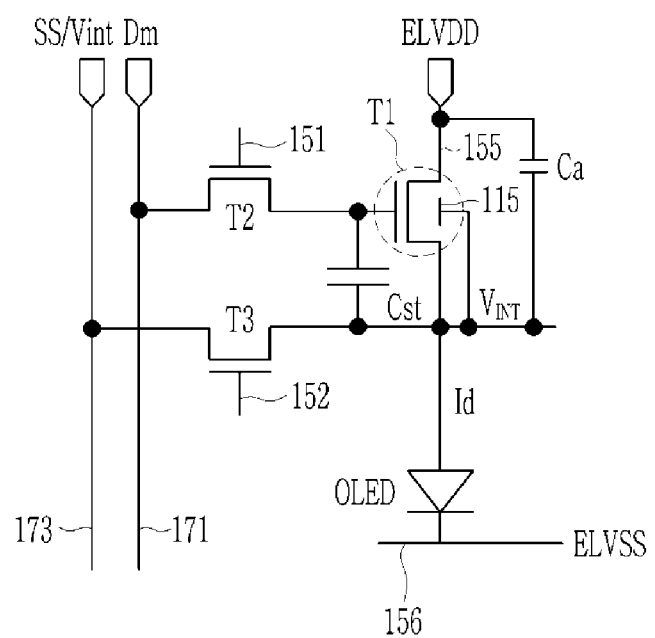
FIG. 15 is an equivalent circuit diagram of one pixel of an organic light emitting diode display of one pixel according to an exemplary embodiment of the present inventive concept.

FIG. 15 is an equivalent circuit diagram of one pixel of an organic light emitting diode display of one pixel according to an exemplary embodiment of the inventive concept.

Referring to FIG. 15, the pixel PX of the organic light emitting diode display includes the plurality of transistors T1, T2, and T3, the storage capacitor Cst, the additional capacitor Ca, and the organic light emitting diode (OLED), which are connected to the several signal lines 151, 152, 171, 173, 155, and 156.

The organic light emitting diode display according to the exemplary embodiment of FIG. 15 is the organic light emitting diode display used in a high resolution display, and one pixel PX is controlled by one data line 171 and one scan line 151.

First, the structure of one pixel PX is described.

The plurality of transistors T1, T2, and T3 included in one pixel PX includes the driving transistor T1 (hereinafter referred to as the first transistor), the switching transistor T2 (e.g., a second transistor) connected to the scan line 151, and the initialization transistor T3 (e.g., a third transistor or a sensing transistor) connected to the previous scan line 152. The third transistor may be connected to a signal line that applies a gate-on voltage at different timing from the previous scan line 152.

The scan line 151 is connected to a gate driver (not shown) to transmit a scan signal Sn to the second transistor T2.

The previous scan line 152 is connected to the gate driver, and transfers the previous scan signal S(n−1) applied to the pixel PX disposed at a previous stage to the third transistor T3.

The data line 171 is a wire for transferring the data voltage Dm generated by the data driver (not shown), and one data line 171 is formed for one pixel PX. One data line 171 and one scan line 151 select one pixel PX to input the data voltage Dm. The luminance emitted by the organic light emitting diode (OLED) is changed depending on the data voltage Dm provided in the pixel PX.

The driving voltage line 155 applies the driving voltage ELVDD, and the driving low voltage line 156 applies the driving low voltage ELVSS. The driving voltage line 155 and the driving low voltage line 156 according to the present exemplary embodiment are wires extending in the longitudinal direction, and are called a longitudinal driving voltage line and a longitudinal driving low voltage line, respectively. In an exemplary embodiment, the voltages applied to the driving voltage line 155 and the driving low voltage line 156 are constant voltages. The driving voltage ELVDD performs a role of the input voltage for generating the output current in the driving transistor T1, and when the output current is applied to an anode of the organic light emitting diode (OLED), the driving low voltage ELVSS is applied to the cathode electrode of the OLED.

Hereinafter, a plurality of transistors will be described.

First, the driving transistor T1 is a transistor controlling the magnitude of the current output according to the data voltage Dm applied to the gate electrode, thereby the output driving current Id is applied to the organic light emitting diode (OLED) and the brightness of the organic light emitting diode (OLED) is controlled depending on the data voltage Dm. For this purpose, the first electrode (the input side electrode) of the driving transistor T1 is disposed to receive the driving voltage ELVDD, and the second electrode (the output side electrode) of the driving transistor T2 is connected to the first electrode (hereinafter referred to as the anode or the pixel electrode) of the organic light emitting diode (OLED). In addition, the gate electrode of the driving transistor T1 is connected to the second electrode (the output side electrode) of the second transistor T2 to receive the data voltage Dm.

In an exemplary embodiment, the gate electrode of the driving transistor T1 is connected to one electrode of the storage capacitor Cst. The storage capacitor Cst ensures that the data voltage Dm transmitted to the gate electrode of the driving transistor T1 is maintained for one frame period. Therefore, the voltage of the gate electrode of the driving transistor T1 changes according to the voltage stored in the storage capacitor Cst, and accordingly the driving current Id output from the driving transistor T1 is changed, and is constantly output for one frame period.

Also, the driving transistor T1 according to an exemplary embodiment further includes an overlapping layer 115 under the semiconductor layer in which the channel is disposed. The overlapping layer 115 overlaps the channel and the gate electrode of the driving transistor T1, thereby improving a characteristic of the driving transistor T1 and maintaining the voltage of the gate electrode. Since the overlapping layer 115 overlaps the gate electrode, the voltage of the gate electrode is maintained, thereby supplementing the capacitance of the storage capacitor Cst. Hereinafter, a capacitor formed by an overlapping between the overlapping layer 115 and the gate electrode of the driving transistor T1 is referred to as an overlapping capacitor (not shown). The overlapping layer 115 is electrically connected to the second electrode (the output side electrode) of the driving transistor T1, and as a result, the overlapping layer 115 is also connected to the anode of the resultant organic light emitting diode (OLED).

The second transistor T2 (hereinafter referred to as the switching transistor) is a transistor that receives the data voltage Dm as input into the pixel PX. The gate electrode of the second transistor T2 is connected to the scan line 151, the first electrode of the second transistor T2 is connected to the data line 171, and the second electrode (the output side electrode) of the second transistor T2 is connected to the gate electrode of the driving transistor T1. If the second transistor T2 is turned on depending on the scan signal Sn transmitted through the scan line 151, the data voltage Dm transmitted through the data line 171 is transmitted to the gate electrode of the driving transistor T1 and is stored to the storage capacitor Cst.

The third transistor T3 (hereinafter referred to as the initialization transistor or the sensing transistor) plays a role of initializing the second electrode (the output side electrode) of the driving transistor T1, one electrode of the storage capacitor Cst, and the anode of the organic light emitting diode (OLED). The gate electrode of the third transistor T3 is connected to the previous scan line 152, and the first electrode is connected to the initialization voltage line 173. The second electrode (the output side electrode) of the third transistor T3 is electrically connected to the second electrode (the output side electrode) of the driving transistor T1, and as a result, is also connected to the anode and the overlapping layer 115 of the organic light emitting diode (OLED).

The initialization voltage line 173 not only provides the initialization voltage, but is also used as a wire (e.g., a sensing line) for sensing the voltage of the anode connected to the second electrode of the third transistor T3 during a sensing period. As a result, the third transistor T3 is also referred to as the sensing transistor.

The operation of the third transistor T3 is now described. The voltage of the anode when the organic light emitting diode (OLED) emits light (the emitting period) is stored in one electrode of the storage capacitor Cst. The data voltage Dm is stored in the other electrode of the storage capacitor Cst. At this time, if the gate-on voltage is applied to the gate electrode of the third transistor T3, the initialization voltage line 173 operates as a sensing line, and the voltage of the anode is transmitted to a sensing unit (not shown) through the sensing line. Hereinafter, this is referred to as the sensing period. Next, in the reset period among a period in which the gate-on voltage is applied to the gate electrode of the third transistor T3, the initialization voltage line 173 applies the initialization voltage Vint to initialize the voltage of the anode. Hereinafter, this is referred to as the initialization period.

If the voltage detected in the sensing period is different from the expected voltage of the anode when it is determined based on the applied data voltage Dm, the data voltage Dm may be modified to be provided to the pixel PX. That is, the characteristic of the driving transistor T1 may be changed, and the organic light emitting diode (OLED) may emit normal light by sensing the change and providing the data voltage Dm corresponding thereto.

That is, two electrodes of the storage capacitor Cst may play a role of maintaining the data voltage Dm and the voltage of the anode (the output electrode voltage of the driving transistor) of the organic light emitting diode (OLED) during one frame period.

Since the area occupied by a pixel PX of an organic light emitting diode display with a high resolution is small and an area for forming a storage capacitor Cst in the pixel PX is also small, sufficient storage capacitance may not be maintained for one frame period.

Therefore, a pixel PX of the present exemplary embodiment further includes the additional capacitor Ca so as to have sufficient storage capacitance to maintain the voltage of the anode of the organic light emitting diode (OLED) for one frame period.

The additional capacitor Ca has one side electrode connected to the anode of the organic light emitting diode (OLED) and the other side electrode to which the driving voltage ELVDD is applied, thereby maintaining the voltage of the anode of the organic light emitting diode (OLED).

That is, the capacitor included in one pixel PX has the storage capacitor Cst and the additional capacitor Ca thereby ensuring the storage capacitance for maintaining the voltage of the anode of the organic light emitting diode (OLED) during one frame period. Also, according to an exemplary embodiment, an overlapping capacitor formed by the overlapping layer 115 may be further included.

Next, the operation of one pixel of the organic light emitting diode display according to an exemplary embodiment is described with reference to FIG. 15 and FIG. 16.

Figure 16:
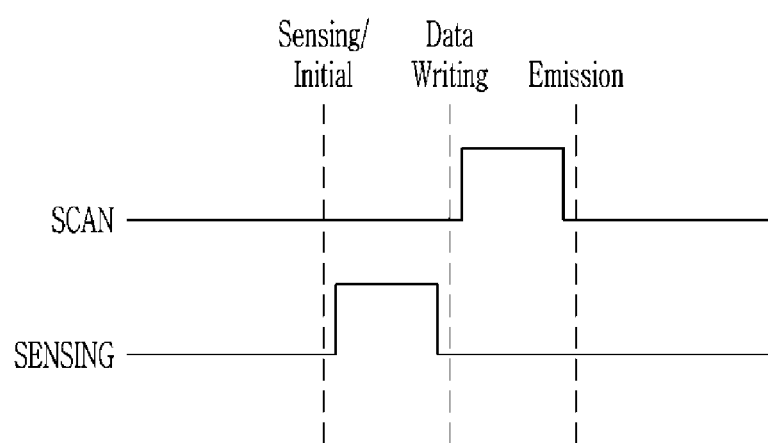
FIG. 16 is a timing diagram of a signal applied to one pixel of an organic light emitting diode display according to an exemplary embodiment of the present inventive concept.

FIG. 16 is a timing diagram of a signal applied to one pixel of an organic light emitting diode display according to an exemplary embodiment of the inventive concept.

In FIG. 16, the signal indicated by SCAN is the signal applied to the scan line 151, and the signal indicated by SENSING is the signal applied to the previous scan line 152.

First, during the sensing/initial period, the previous scan signal S(n-1) of a high level is supplied to the pixel PX through the previous scan line 152. Then, the third transistor T3 receiving the previous scan signal S(n-1) is turned on. At this time, the voltage stored in the anode of the organic light emitting diode (OLED) is confirmed through the initialization voltage line 173 (the sensing period), and then the voltage of the anode of the organic light emitting diode is changed into the initialization voltage Vint to be initialized. (Initialization period)

When the characteristic of the driving transistor T1 changes while the driving transistor T1 disposed at each pixel PX has different threshold voltages Vth due to a process dispersion or is operated during a long term by the sensing period, this change is sensed so that the organic light emitting diode (OLED) normally emits light.

Next, during the data writing period, the scan signal Sn of a high level is supplied to the pixel PX through the scan line 151. The second transistor T2 is turned on by the scan signal Sn of a high level. If the second transistor T2 is turned on, the data voltage Dm is input to the gate electrode of the driving transistor T1 via the second transistor T2, and is stored to one side electrode of the storage capacitor Cst.

The turned-on degree of the driving transistor T1 is determined according to the data voltage Dm applied to the gate electrode, and the driving transistor T1 outputs the driving voltage ELVDD which is input to the first electrode to be transmitted to the anode of the organic light emitting diode (OLED).

The voltage of the anode of the organic light emitting diode (OLED) is stored in the additional capacitors Ca and Cb or the overlapping capacitor as well as the storage capacitor Cst, and is maintained during one frame period.

In the above, the circuit structure was mainly described through FIG. 15 and FIG. 16.

Hereinafter, how the pixel PX according to an exemplary embodiment is implemented is described with reference to FIG. 17 to FIG. 20.

Figure 17:
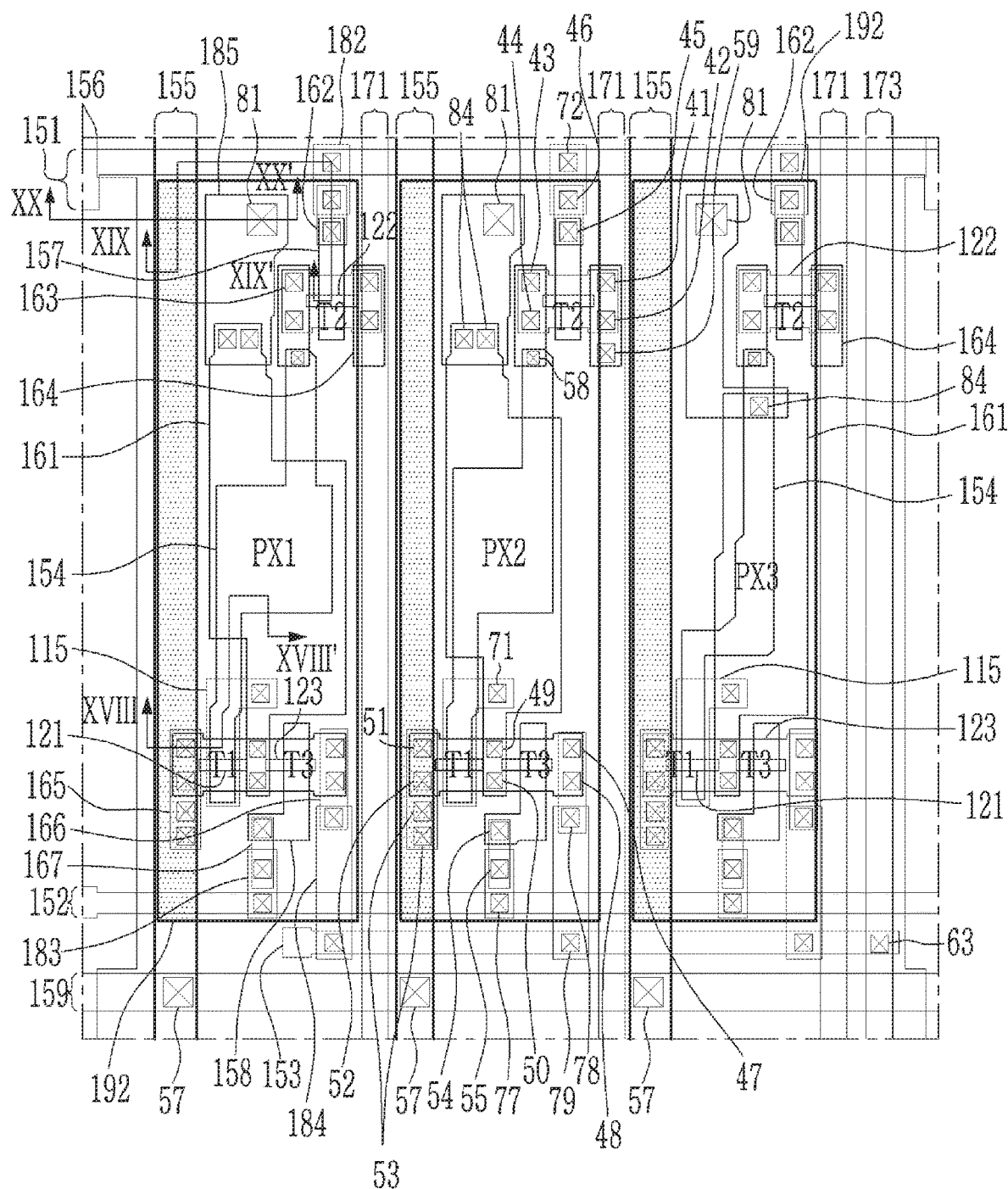
FIG. 17 is a layout view of one pixel area of an organic light emitting diode display according to an exemplary embodiment of the present inventive concept.
Figure 18:
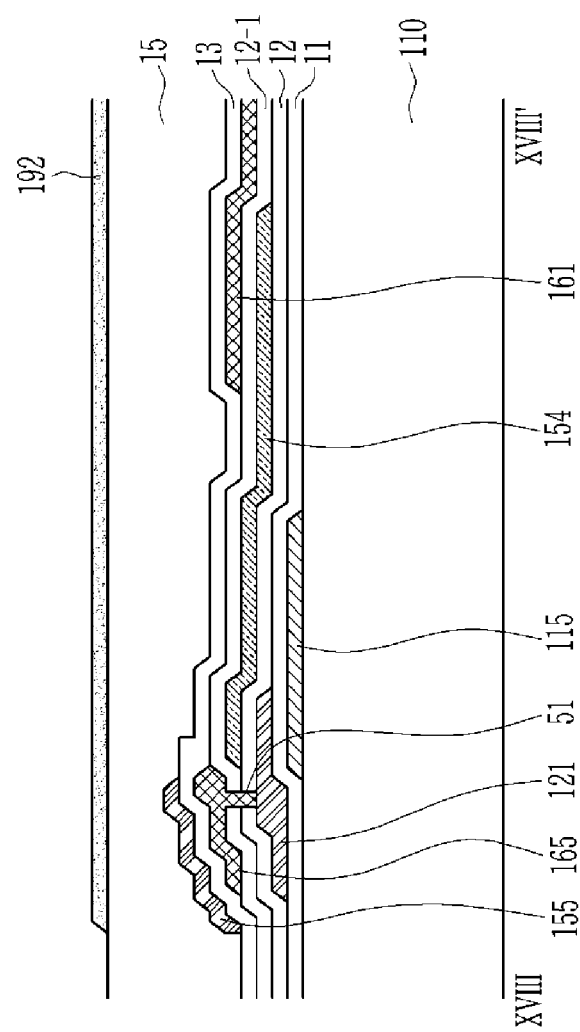
FIG. 18 is a cross-sectional view taken along a line XVIII-XVIII' in an exemplary embodiment of FIG. 17.
Figure 19:
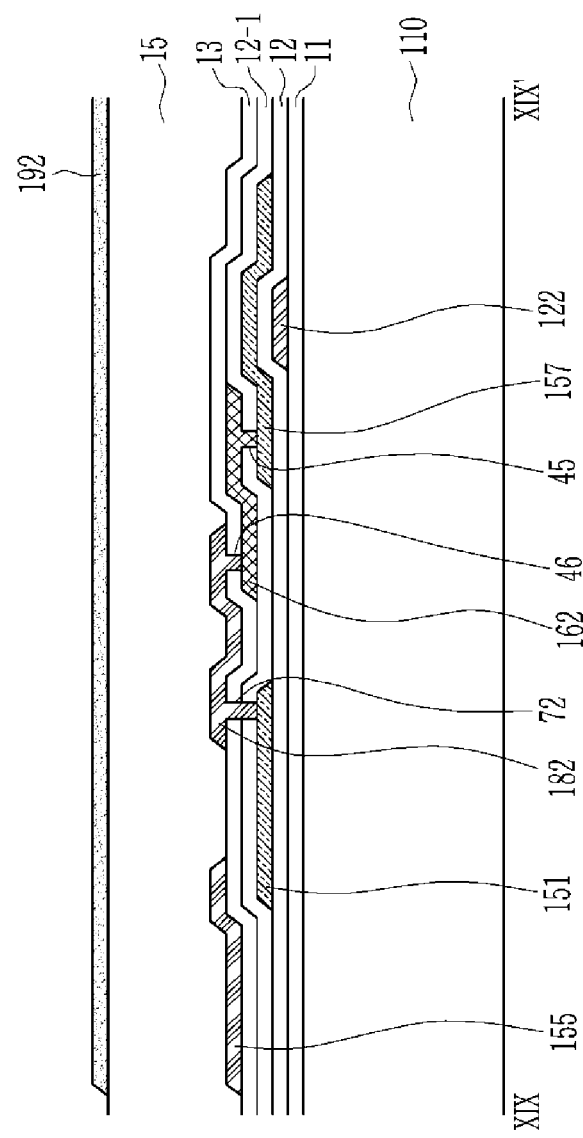
FIG. 19 is a cross-sectional view taken along a line XIX-XIX' in an exemplary embodiment of FIG. 17.
Figure 20:
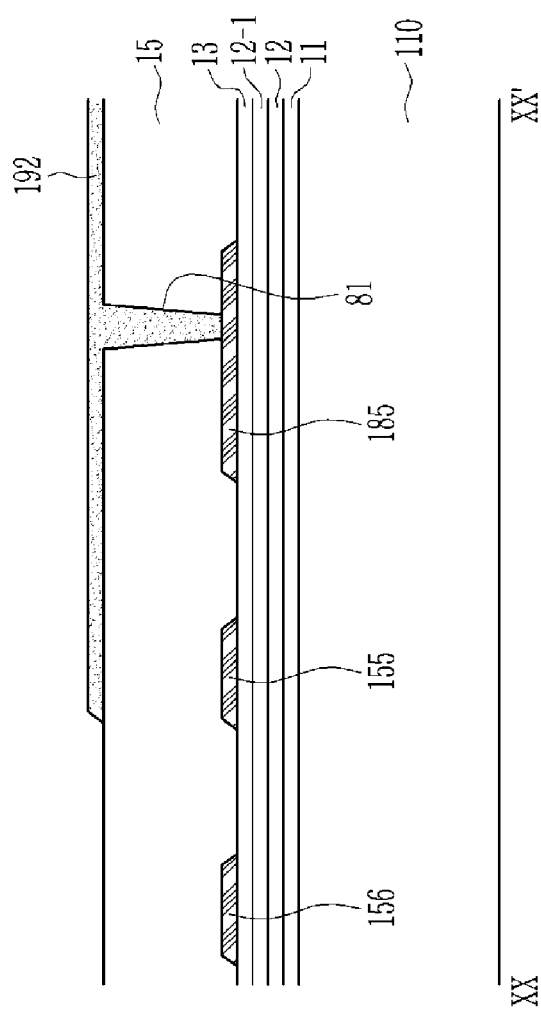
FIG. 20 is a cross-sectional view taken along a line XX-XX' in an exemplary embodiment of FIG. 17.

FIG. 17 is a layout view of a region of one pixel of an organic light emitting diode display according to an exemplary embodiment, and FIG. 18, FIG. 19, and FIG. 20 are a cross-sectional views taken along lines XVIII-XVIII', XIX-XIX', and XX-XX' in an exemplary embodiment of FIG. 10.

Referring to FIG. 17 to FIG. 20, in the organic light emitting diode display according to an exemplary embodiment, the overlapping layer 115, the semiconductor layer (121, 122, and 123), the gate layer (151, 152, 153, 154, 157, 158, and 159), the second gate layer (161, 162, 163, 164, 165, 166, and 167), the first data layer (171, 173, 155, 156, 182, 183, 184, and 185), the anode 192, the organic emission layer (not shown), and a common electrode (not shown) are formed on the substrate 110, respectively, and these layers are insulated from each other by an insulating layer between them unless they are connected by an opening.

The substrate 110 may be formed as a glass substrate or a flexible substrate containing plastic or polyimide (PI). When the substrate 110 is formed as the flexible substrate, unlike the case of the glass substrate, an additional inorganic insulating layer may be formed.

The overlapping layer 115 formed on the substrate 110 is described. The overlapping layer 115 includes an overlapping part overlapping a channel of the driving transistor T1 and a connection part. The connection part of the overlapping layer 115 is connected to a later-described storage electrode 161. Since the storage electrode 161 receives the voltage of the anode, the overlapping layer 115 also receives the voltage of the anode. The overlapping layer 115 may form an overlapping capacitor in the region overlapping the gate electrode 154 of the driving transistor T1.

The buffer layer 11 covers the substrate 110 and the overlapping layer 115. The buffer layer 11 may be formed of the inorganic insulating material.

The semiconductor layer (121, 122, and 123) is formed on the buffer layer 11. Each semiconductor layer (121, 122, and 123) includes the channels of the driving transistor T1, the second transistor T2, and the third transistor T3. The semiconductor layer (121, 122, and 123) according to an exemplary embodiment is formed of an oxide semiconductor. The first semiconductor 121 as the semiconductor layer of the driving transistor T1 includes the channel region and the source/drain region disposed at both sides of the channel region. The second semiconductor 122 as the semiconductor layer of the second transistor T2 includes the channel region and the source/drain region disposed at both sides of the channel region, and the third semiconductor 123 as the semiconductor layer of the third transistor T3 includes the channel region and the source/drain region disposed at both sides of the channel region.

The channel region of each semiconductor layer (121, 122, and 123) may be formed as two lines including an opening at the center of the quadrangle, or may be formed as one line to connect the source/drain regions.

The source/drain region of each semiconductor layer (121, 122, and 123) is electrically connected to the first electrode/the second electrode (the output side electrode), respectively. Also, the source/drain region extends to be electrically connected to another layer through an opening.

The first gate insulating layer 12 covers the semiconductor layer (121, 122, and 123) and the buffer layer 11. The first gate insulating layer 12 may be formed of an inorganic insulating material.

The gate layer (151, 152, 153, 154, 157, 158, and 159) is formed on the first gate insulating layer 12. The gate layer includes the scan line 151, the previous scan line 152, the initialization voltage transmitting part 153, the gate electrode 154 of the driving transistor T1, the gate electrode 157 of the second transistor T2, the gate electrode 158 of the third transistor T3, and a transverse driving voltage line 159.

The scan line 151 extends in the first direction (the transverse direction), and the previous scan line 152 also extends in the first direction (the transverse direction).

The initialization voltage transmitting part 153 has the island shape formed long in the first direction (the transverse direction). The initialization voltage transmitting part 153 is the structure for connecting the initialization voltage line 173 formed for a predetermined number of pixel columns and a plurality of pixels. That is, the initialization voltage transmitting part 153 passes the pixel PX adjacent in the first direction (the transverse direction), and extends to the position where the initialization voltage line 173 is formed. In the present exemplary embodiment, one initialization voltage line 173 is formed for three pixels PX1, PX2, and PX3.

The transverse driving voltage line 159 extends in the first direction (the transverse direction), and crosses the driving voltage line 155 extending in the second direction (the longitudinal direction). The transverse driving voltage line 159 is disposed between the pixels PX adjacent in the second direction (the longitudinal direction), and is electrically connected to the driving voltage line 155 through an opening 57 for each pixel PX1, PX2, and PX3 adjacent in the first direction (the transverse direction).

The gate electrode 154 of the driving transistor T1 includes an overlapping part overlapping the first semiconductor 121 in which a channel of the driving transistor T1 is disposed, an extension part extended from the overlapping part, and an extending part connected to the second semiconductor 122 of the second transistor T2. In an embodiment, only the overlapping part of the gate electrode 154 of the driving transistor T1 performs the role of the gate electrode, and the extension part forms one side electrode of the storage capacitor Cst. The extension part of the gate electrode 154 overlaps the extension part of the overlapping layer 115 to form an overlapping capacitor. The extending part of the gate electrode 154 is connected to the second semiconductor 122 of the second transistor T2 through openings 43, 44, and 58 and a second gate layer connection part 163, and receives the data voltage Dm from the second electrode of the second transistor T2.

FIG. 17 shows three pixels PX1, PX2, and PX3, and the gate electrode 154 of the driving transistor T1 of each of the pixels PX1, PX2, and PX3 may be formed with various sizes. Here, the three pixels PX1, PX2, and PX3 may respectively display one color among three primary colors. For example, pixel PX1 could display red, pixel PX2 could display green, and pixel PX3 could display blue.

The gate electrode 157 of the second transistor T2 has the island structure, and overlaps the second semiconductor 122 of the second transistor T2. The channel of the second transistor T2 is formed at the position where the second semiconductor 122 and the gate electrode 157 overlap. The gate electrode 157 is electrically connected to the scan line 151 through the second gate electrode connection part 182 and a second gate layer connection part 162.

The gate electrode 158 of the third transistor T3 has the island structure, and overlaps the third semiconductor 123 of the third transistor T3. The channel of the third transistor T3 is formed at the position where the third semiconductor 123 and the gate electrode 158 overlap. The gate electrode 158 is electrically connected to the previous scan line 152 through the third gate electrode connection part 183 and a second gate layer connection part 167.

The second gate insulating layer 12-1 covers the gate layer (151, 152, 153, 154, 157, 158, and 159), the first gate insulating layer 12, and the second gate insulating layer 12-1. The second gate insulating layer 12-1 may be formed of an inorganic insulating material.

The second gate layer (161, 162, 163, 164, 165, 166, and 167) is disposed on the second gate insulating layer 12-1, and the second gate layer includes the storage electrode 161 and the second gate connection parts 162, 163, 164, 165, 166, and 167.

The storage electrode 161 has an extension part overlapping the extension part of the gate electrode 154 of the driving transistor T1, and includes a first extending part and a second extending part respectively extending upward and downward from the extension part. The first extending part extending downward from the extension part of the storage electrode 161 is connected to the second electrode (the output side electrode) of the driving transistor T1 through openings 49 and 50 and the overlapping layer 115 through the opening 71. The second extending part extending upward from the extension part of the storage electrode 161 is connected to the anode connection part 185 through the opening 84. The extension part of the storage electrode 161 overlaps the gate electrode 154 to form the storage capacitor Cst.

The extension part of the storage electrode 161 and the extension part of the gate electrode 154 occupy a large area in the pixel PX, but the area where the pixel PX is formed with high resolution is reduced, resulting in a problem of an insufficient capacitance of the storage capacitor Cst. To prevent this problem, the additional capacitors Ca are further formed, and this is described later.

The second gate layer connection part 162 has the island structure, and overlaps the second gate electrode connection part 182 and the gate electrode 157 of the second transistor T2. The second gate electrode connection part 182 is connected to the second gate electrode connection part 182 and the gate electrode 157 of the second transistor T2 through openings 46 and 45, respectively.

The second gate layer connection part 163 has the island structure, and overlaps the second electrode (output side electrode) among the region of the gate electrode 154 of the driving transistor T1 and the second semiconductor 122 of the second transistor T2. The second gate layer connection part 163 is connected to the second electrode (the output side electrode) among the region of the second semiconductor 122 of the second transistor T2 through the two openings 43 and 44, and is connected to the gate electrode 154 of the driving transistor T1 through the opening 58.

The second gate layer connection part 164 has the island structure, and overlaps the data line 171 and the first electrode among the region of the second semiconductor 122 of the second transistor T2. The second gate layer connection part 164 is connected to the first electrode among the region of the second semiconductor 122 of the second transistor T2 through two openings 41 and 42, and is connected to the data line 171 through an opening 59.

The second gate layer connection part 165 has the island structure, and overlaps the driving voltage line 155 and the second electrode (the output side electrode) among the region of the first semiconductor 121 of the driving transistor T1. The second gate layer connection part 165 is connected to the second electrode of the driving transistor T1 through two openings 51 and 52, and is connected to the driving voltage line 155 through two openings 53.

The second gate layer connection part 166 has the island structure, and overlaps the initialization voltage second transmitting part 184 and the first electrode among the region of the third semiconductor 123 of the third transistor T3. The second gate layer connection part 166 is connected to the first electrode of the third transistor T3 through two openings 47 and 48, and is connected with the initialization voltage second transmitting part 184 through the opening 78.

The second gate layer connection part 167 has the island structure, and overlaps the third gate electrode connection part 183 and the gate electrode 158 of the third transistor T3. The second gate layer connection part 167 is connected to the gate electrode 158 of the third transistor T3 through an opening 54 and is connected to the third gate electrode connection part 183 through an opening 55.

The interlayer insulating layer 13 covers the second gate layer (161, 162, 163, 164, 165, 166, and 167) and the second gate insulating layer 12-1. The interlayer insulating layer 13 may be formed of an inorganic insulating material.

The first data layer (171, 173, 155, 156, 182, 183, 184, and 185) is formed on the interlayer insulating layer 13. The first data layer includes the data line 171, the initialization voltage line 173, the driving voltage line 155, the driving low voltage line 156, the second gate electrode connection part 182, the third gate electrode connection part 183, an initialization voltage second transmitting part 184, and the anode connection part 185.

The data line 171 is formed for each pixel and is extended in the second direction (the longitudinal direction) perpendicular to the first direction (the transverse direction). The data line 171 is connected to the second gate layer connection part 164 and the second semiconductor 122 of the second transistor T2 through the opening 59, and applies the data voltage Dm to the second transistor T2.

The initialization voltage line 173 is extended in the second direction (the longitudinal direction) and applies the initialization voltage Vint. The initialization voltage line 173 is not formed per each pixel, and in the present exemplary embodiment, one initialization voltage line 173 is formed for each of three pixels PX1, PX2, and PX3. The initialization voltage line 173 is connected to the initialization voltage transmitting part 153 through the opening 63, and the initialization voltage transmitting part 153 is connected to the initialization voltage second transmitting part 184 through the opening 79. The initializing voltage second transmitting part 184 is connected to the second gate layer connection part 166 and the third semiconductor 123 of the third transistor T3 through the opening 78. As a result, the initialization voltage Vint is applied to the first electrode of the third transistor T3 of each pixel.

The driving voltage line 155 and the driving low voltage line 156 are extended in the second direction (the longitudinal direction). The driving voltage line 155 is disposed for every pixel, but the driving low voltage line 156 is disposed for every three pixels PX1, PX2, and PX3. The driving voltage line 155 transmits the driving voltage ELVDD, and is connected to the second gate layer connection part 165 and the first semiconductor 121 of the driving transistor T1 through two openings 53 to transmit the driving voltage ELVDD to the first electrode of the driving transistor T1. In an embodiment, the driving voltage line 155 has a narrow width as compared to the driving low voltage line 156. The driving low voltage line 156 may have the narrow width in the region overlapping the wiring disposed on another layer, and have the narrow width at the portion overlapping the scan line 151 in FIG. 17. The driving low voltage line 156 having a wide width is for forming the structure that is electrically connected to transmit the driving low voltage ELVSS to the upward cathode. That is, this is because a width of a predetermined level is required to be electrically connected by forming the contact by laser, and the like.

The second gate electrode connection part 182 has the island structure, and overlaps the scan line 151 and the second gate layer connection part 162. The second gate layer connection part 162 overlaps the gate electrode 157 of the second transistor T2. The second gate electrode connection part 182 is connected to the scan line 151 and the second gate layer connection part 162 through the openings 72 and 46, respectively, and the second gate layer connection part 162 is connected to the gate electrode 157 of the second transistor T2 through the opening 45, thereby transmitting the scan signal Sn applied to the scan line 151 to the gate electrode 157 of the second transistor T2.

The third gate electrode connection part 183 has the island structure, and overlaps the previous scan line 152 and second gate layer connection part 167. The second gate layer connection part 167 overlaps the gate electrode 158 of the third transistor T3. The third gate electrode connection part 183 is connected to the second gate layer connection part 167 and the previous scan line 152 through the openings 77 and 55, respectively, and the second gate layer connection part 167 is connected to the gate electrode 157 of the third transistor T3 through the opening 54, thereby transmitting the previous scan signal S(n−1) applied to the previous scan line 152 to the gate electrode 158 of the third transistor T3.

The anode connection part 185 is connected to the second extending part of the storage electrode 161 through two underlying openings 84, and is connected to the anode 192 through the overlying opening 81. As a result, the output current of the driving transistor T1 is transmitted to the anode 192.

The upper insulating layer 15 disposed on the first data layer (171, 173, 155, 156, 182, 183, 184, and 185) and the interlayer insulating layer 13. The upper insulating layer 15 is formed of the organic insulating material, and has the characteristic of removing and flattening the step.

The anode 192 is formed on the upper insulating layer 15.

The anode 192 as one electrode of the organic light emitting diode (OLED) transfers the current output from the driving transistor T1 to the organic emission layer. The anode 192 is connected to the anode connection part 185 through the opening 81 to receiving the current output from the driving transistor T1, and the anode connection part 185 is connected to the storage electrode 161 through the opening 84.

Referring to FIG. 17, the anode 192 is disposed over the entire surface of the pixel to overlap the driving transistor T1, the second transistor T2, and the third transistor T3, and one side of the driving voltage line 155 overlaps one side of the anode 192.

Here, the region where anode 192 overlaps the driving voltage line 155 forms the additional capacitor Ca. The region forming the additional capacitor Ca is described in detail with reference to the cross-sectional view of FIG. 18, FIG. 19, and FIG. 20.

Referring to FIG. 18, the overlapping layer 115 is formed on the substrate 110, the buffer layer 11 covers the overlapping layer 115, and the first semiconductor 121 of the driving transistor T1 is formed on the buffer layer 11. The first gate insulating layer 12 is formed to cover the first semiconductor 121, and the gate electrode 154 of the driving transistor T1 is formed on the first gate insulating layer 12. The second gate insulating layer 12-1 is formed to cover the gate electrode 154, and the second gate layer connection part 165 formed on the second gate insulating layer 12-1 is connected to the first semiconductor 121 through the opening 51. The interlayer insulating layer 13 is formed to cover the second gate layer connection part 165, and the driving voltage line 155 is formed on the interlayer insulating layer 13. The upper insulating layer 15 is formed on the driving voltage line 155, and the anode 192 is formed on the upper insulating layer 15 to overlap the overlapping layer 115, the first semiconductor 121 of the driving transistor T1, the gate electrode 154, the storage electrode 161, the second gate layer connection part 165, and the driving voltage line 155.

Here, one end of the driving voltage line 155 is disposed on the same line at one end of the anode 192 on a virtual extension line. The region where the driving voltage line 155 and the anode 192 overlap forms the additional capacitor Ca, which may have sufficient capacitance in a narrow area of a high resolution organic light emitting diode (OLED) display.

Referring to FIG. 19, the anode 192 is formed upward to overlap the second semiconductor 122, the gate electrode 157 of the second transistor T2, the scan line 151, the second gate layer connection part 162, the second gate electrode connection part 182, and the driving voltage line 155. In FIG. 5, it may be confirmed that one end of the driving voltage line 155 is disposed on the same line as one end of the anode 192 on a virtual extension line.

Referring to FIG. 20, the buffer layer 11, the first gate insulating layer 12, the second gate insulating layer 12-1, and the interlayer insulating layer 13 are sequentially formed on the substrate 110, and the driving low voltage line 156, the driving voltage line 155, and the anode connection part 185 are formed on the interlayer insulating layer 13. The upper insulating layer 15 covers the driving low voltage line 156, the driving voltage line 155, and the anode connection part 185, and the anode 192 is formed on the upper insulating layer 15.

The anode 192 is only formed at the upper region overlapping the driving voltage line 155 and the anode connection part 185, and does not overlap the driving low voltage line 156. The anode 192 is connected to the anode connection part 185 through the opening 81, and transmits the output current of the driving transistor T1 to the anode 192.

Although not shown, a partition may be formed between anodes 192 of adjacent pixels. The partition has an opening that exposes the anode 192, and the organic emission layer may be formed in the opening.

The cathode is disposed on the organic emission layer and the partition. The partition further includes the opening exposing the cathode connection part. The cathode is connected to the exposed cathode connection part to receive the driving low voltage ELVSS.

According to the above structure, the anode 192 and the driving voltage line 155 overlap to form the additional capacitor Ca. According to the exemplary embodiment, the capacitor may be formed by the region where the anode 192 is extended to overlap the driving low voltage line 156. As a result, the voltage of the anode may be additionally maintained.

Again referring to FIG. 17, the anode 192 and the driving voltage line 155 overlap the second electrode (the output side electrode) of the driving transistor T1, that is, the source region. In an embodiment, the driving voltage line 155 does not overlap the second electrode (the output side electrode) of the second transistor T2, that is, the source region. The source region of the second transistor T2 overlaps only the data line 171 and the anode 192 does not overlap the data line 171, preventing crosstalk due to parasitic capacitance between the data line 171 and the anode 192.

While inventive concept has been particularly shown and described with reference to embodiments thereof, it is to be understood that various changes in form and details may be made therein without departing from spirit and scope of the inventive concept.

What is claimed is:

1. An organic light emitting diode display comprising:
a substrate;
a semiconductor layer;
a first gate insulating layer disposed on the semiconductor layer;
a first gate layer disposed on the first gate insulating layer;
a first interlayer insulating layer disposed on the first gate layer;
a first data layer disposed on the first interlayer insulating layer;
a second interlayer insulating layer disposed on the first data layer;
a driving voltage line and a driving low voltage line disposed on the second interlayer insulating layer and separated from each other;
an upper insulating layer covering the driving voltage line and the driving low voltage line; and
an anode disposed on the upper insulating layer and overlapping at least part of the driving voltage line or at least part of the driving low voltage line,
wherein the driving low voltage line provides a first voltage to a cathode and the driving voltage line provides a second voltage different from the first voltage.

2. The organic light emitting diode display of claim 1, wherein the driving voltage line and the driving low voltage line extend in a longitudinal direction.

3. The organic light emitting diode display of claim 2, wherein the anode is electrically connected to an anode connection part formed to be separated from the driving voltage line and the driving low voltage line on a same layer.

4. The organic light emitting diode display of claim 3, comprising a plurality of pixels wherein the anode is disposed in each of the pixels.

5. The organic light emitting diode display of claim 4, wherein a part of the anode overlaps the driving voltage line, and another part of the anode overlaps the driving low voltage line.

6. The organic light emitting diode display of claim 5, wherein the anode connection part is disposed between the driving voltage line and the driving low voltage line.

7. The organic light emitting diode display of claim 4, wherein the anode overlaps the driving voltage line.

8. The organic light emitting diode display of claim 7, wherein the driving voltage line has an anode connection part opening corresponding to the anode connection part, and the anode connection part is disposed within the anode connection part opening.

9. The organic light emitting diode display of claim 1, further comprising:
an organic emission layer disposed on the anode; and
the cathode disposed on the organic emission layer, wherein the cathode is electrically connected to a cathode connection part disposed on a same layer as the anode, and the cathode connection part is electrically connected to the driving low voltage line.

10. The organic light emitting diode display of claim 1, wherein the driving voltage line has a larger width than the anode, and the driving low voltage line has a width that is larger than half of the width of the anode.

11. The organic light emitting diode display of claim 1, wherein the first gate layer includes a pair of scan lines receiving a same scan signal, the first data layer includes a pair of data lines connected to one pixel column, among two adjacent pixels included in the one pixel column, one pixel is connected to one scan line of the pair of scan lines and one data line of the pair of data lines, and the other pixel is connected to the other scan line of the pair of scan lines and the other data line of the pair of data lines.

12. An organic light emitting diode display comprising:
a substrate;
a semiconductor layer;
a first gate insulating layer disposed on the semiconductor layer;
a first gate layer disposed on the first gate insulating layer;
a first interlayer insulating layer disposed on the first gate layer;
a first data layer disposed on the first interlayer insulating layer;
a second interlayer insulating layer disposed on the first data layer;
a driving voltage line and a driving low voltage line disposed on the second interlayer insulating layer and separated from each other;
an upper insulating layer covering the driving voltage line and the driving low voltage line;
an anode disposed on the upper insulating layer and overlapping the driving voltage line or the driving low voltage line; and
an overlapping layer disposed between the substrate and the semiconductor layer, the overlapping layer includes a channel overlapping part overlapping with a channel of a first transistor and an extension part extended from the channel overlapping part, and the extension part of the overlapping layer overlaps with a first gate electrode of the first transistor to form an overlapping capacitor.

* * * * *